(12) United States Patent
Zhu

(10) Patent No.: US 11,387,405 B2
(45) Date of Patent: Jul. 12, 2022

(54) RESONANCE ROTATING SPIN-TRANSFER TORQUE MEMORY DEVICE

(71) Applicant: Carnegie Mellon University, Pittsburgh, PA (US)

(72) Inventor: Jian-Gang Zhu, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 16/201,590

(22) Filed: Nov. 27, 2018

(65) Prior Publication Data

US 2019/0165255 A1    May 30, 2019

Related U.S. Application Data

(60) Provisional application No. 62/707,992, filed on Nov. 27, 2017.

(51) Int. Cl.
*H01L 43/02* (2006.01)
*H01L 43/10* (2006.01)
(Continued)

(52) U.S. Cl.
CPC ............ *H01L 43/02* (2013.01); *G11C 11/161* (2013.01); *H01F 10/329* (2013.01);
(Continued)

(58) Field of Classification Search
CPC ......... H01L 43/02; H01L 43/08; H01L 43/10; H01L 43/12; H01L 27/222–228; H01L 27/11507; H01L 29/685; H01L 2924/1434; H01L 2924/1441; H01L 2924/1435; H01L 43/04; H01L 43/06; H01L 43/065; H01L 27/105; H01L 27/22; H01F 10/3286; H01F 10/329; H01F 10/3254; H01F 10/3236; H01F 10/3272; H01F 10/3263;
(Continued)

(56) References Cited

U.S. PATENT DOCUMENTS

2012/0280339 A1* 11/2012 Zhang .................... G11C 11/16
257/421
2013/0229866 A1* 9/2013 Ranjan .................. G11C 11/161
365/171

(Continued)

*Primary Examiner* — Natalia A Gondarenko
(74) *Attorney, Agent, or Firm* — Fish & Richardson P.C.

(57) ABSTRACT

A memory device includes a plurality of layers forming a stack. The plurality of layers include a spin polarization layer having a magnetic anisotropy approximately perpendicular to a plane of the spin polarization layer, an antiferromagnetic layer having an antiferromagnetic material, a ferromagnetic layer that is exchange coupled to the antiferromagnetic layer, where the antiferromagnetic layer is between the ferromagnetic layer and the spin polarization layer, and a storage layer having a magnetization direction that indicates a memory state of the storage layer. The memory state is switched by an amount of current through the stack. The spin polarization layer, the ferromagnetic layer, and the antiferromagnetic layer are configured to reduce the amount of current through the stack for switching the magnetization direction of the storage layer relative to an amount of current through a memory device without the spin polarization layer, the ferromagnetic layer, and the antiferromagnetic layer.

19 Claims, 13 Drawing Sheets

(51) Int. Cl.
*H01L 27/22* (2006.01)
*H03B 15/00* (2006.01)
*H01F 10/32* (2006.01)
*G11C 11/06* (2006.01)
*G11C 11/16* (2006.01)

(52) U.S. Cl.
CPC ..... *H01F 10/3254* (2013.01); *H01F 10/3272* (2013.01); *H01F 10/3286* (2013.01); *H01L 27/222* (2013.01); *H01L 43/10* (2013.01); *H03B 15/006* (2013.01)

(58) Field of Classification Search
CPC ... G11C 11/15; G11C 11/161; G11C 11/1653; G11C 14/0036; G11C 14/0045; G11C 14/0081; G11C 19/02; G11C 19/08; G11C 19/0825; G11C 19/14; G11C 19/28; G11C 19/34; G11C 19/282
USPC ............ 257/421, 295, 21.665, 27.005; 438/3
See application file for complete search history.

(56) References Cited

U.S. PATENT DOCUMENTS

| | | | |
|---|---|---|---|
| 2015/0171316 A1* | 6/2015 | Park | H01L 43/12 257/421 |
| 2017/0077394 A1* | 3/2017 | Saida | H01L 43/08 |
| 2019/0051822 A1* | 2/2019 | Chatterjee | H01L 43/02 |
| 2020/0043536 A1* | 2/2020 | Kuo | H01L 43/08 |

* cited by examiner

RESONANCE ROTATING SPIN-TRANSFER TORQUE MEMORY DEVICE

CLAIM OF PRIORITY

This application claims priority under 35 U.S.C. § 119(e) to U.S. Patent Application Ser. No. 62/707,992, filed on Nov. 27, 2017, the entire contents of which are hereby incorporated by reference.

TECHNICAL FIELD

The devices described herein relate to computer memory for computing and data storage.

BACKGROUND

Present computer memory hierarchy generally comprises the following architectures, described here from the fastest to the slowest. First, L1/L2/L3 cache memory are static random access memory (SRAM) or latches with each memory cell generally consisting of 6-transistors. SRAM is generally operating with bandwidth on the order of GHz, but it is expensive with each cell occupying area on the order of $300F^2$, where F is the minimum pitch dimension at M1 level for a particular fabrication technology node. SRAM is volatile and on average 60% power consumption is spent on maintaining the memory state.

Second, dynamic random access memory (DRAM) includes memory cells each consisting of a transistor and one capacitor (1T-1C). The transistor functions as a selection device for addressing each memory cell individually in a two dimensional array of memory cells. DRAM are also volatile memory since refreshing of the memory states is required for roughly every $\frac{1}{1000}$ of second.

Third, solid state drive (SSD) and hard disk drive (HDD) memory are generally the archival data storage devices in a typical computer. SSD uses NAND flash memory and HDD uses magnetic disk for storing data bits and both are non-volatile and extremely high storage density. Developments in flash devices are advancing towards 3D NAND technology. Although inexpensive, the access time is very limited, especially for HDDs.

SUMMARY

Spin transfer torque (STT) magnetic random access memory (MRAM) is an emerging technology that may be a replacement of embedded flash (eFLASH) memory. The present form of STT MRAM is 1T-1M (one transistor and one memory element) with a magnetic tunnel junction (MTJ) as a storage element. An MTJ is connected to a transistor for write/read selection in a memory array. One of the main advantages of magnetic memory over many other emerging nonvolatile memory technologies is that magnetic memory includes infinite cycle-ability free of material fatigue. Magnetic memory includes an access bandwidth of approximately 100 MHz with speed comparable to DRAM.

However, for conventional STT MRAM, a challenge is that the switching current threshold is relatively high compared to currents required for some of the other memory types. A consequence of this is that a size of the addressing transistor of the STT MRAM is significantly larger than a minimum transistor size, so that the addressing transistor is capable of providing sufficient write current for the state switching. As downsize scaling occurs, a percentage differential between the addressing transistor size and minimum transistor size significantly increases because the switching current threshold of conventional STT MRAM devices cannot scale down with downsize scaling due the requirement of magnetic stability.

The resonance rotating spin-transfer torque memory device described herein comprises a magnetic multilayer stack to add on to the conventional STT-MRAM. The magnetic multilayer stack provides a rotating spin transfer torque to the free layer during write operations in addition to the spin transfer torque arising from the reference layer. This rotating spin transfer torque has an angular frequency approximately equal to the ferromagnetic resonance frequency of the free layer. The magnetic multilayer stack of the resonance rotating spin-transfer torque memory device reduces the threshold current for switching the magnetization of the free layer, relative to conventional STT MRAM devices without the magnetic multilayer stack, at similar switching speeds. Alternatively or in addition, the resonance rotating spin-transfer torque memory devices are configured to reduce a switching time using a similar write current as conventional STT MRAM devices.

A memory device includes a plurality of layers forming a stack. The plurality of layers include a spin polarization layer including a magnetic anisotropy approximately perpendicular to a plane of the spin polarization layer. The plurality of layers include an antiferromagnetic layer comprising an antiferromagnetic material. The plurality of layers include a ferromagnetic layer that is exchange coupled to the antiferromagnetic layer, wherein the antiferromagnetic layer is between the ferromagnetic layer and the spin polarization layer. The plurality of layers include a storage layer having a magnetization direction that indicates a memory state of the storage layer, the memory state configured to be switched by an amount of current through the stack. The spin polarization layer, the ferromagnetic layer, and the antiferromagnetic layer are configured to reduce the amount of current through the stack for switching the magnetization direction of the storage layer relative to an amount of current through a memory device without the spin polarization layer, the ferromagnetic layer, and the antiferromagnetic layer.

In some implementations, the amount of current through the stack for switching the magnetization direction of the storage layer is reduced by more than 60%.

In some implementations, the ferromagnetic layer comprises a synthetic antiferromagnet tri-layer formed by two ferromagnetic layers sandwiching a metal layer, and the two ferromagnetic layers are configured for antiparallel coupling.

In some implementations, the memory device includes a reference layer comprising a magnetic anisotropy approximately perpendicular to a plane of the reference layer, the storage layer being between the reference layer and the antiferromagnetic layer, the reference layer configured to form a magnetization orientation reference for the magnetization direction of the storage layer. The reference layer is further configured to cause a resistance difference between a first magnetization direction and a second, opposite magnetization direction of the storage layer.

In some implementations, the memory device includes a layer of insulating material forming a tunnel barrier disposed between the storage layer and the reference layer. The layer of insulating material forms a magnetic tunnel junction with the storage layer and the reference layer.

In some implementations, the memory device includes a layer of insulating material forming a metallic non-magnetic conducting layer in between the storage layer and the reference layer. The layer of insulating material forms a magnetoresistive tri-layer structure with the storage layer and the reference layer.

In some implementations, the memory device includes a flux compensation layer including a perpendicular magnetic anisotropy relative to a plane of the flux compensation layer. The reference layer is disposed between the flux compensation layer and the storage layer. A magnetization direction of the flux compensation layer is approximately opposite to the magnetic direction of the reference layer. The flux compensation layer is configured to compensate for stray magnetic flux from the reference layer.

In some implementations, the memory device includes an interlayer disposed between the flux compensation layer and the reference layer. The interlayer is configured to facilitate antiparallel magnetic coupling between the flux compensation layer and the reference layer. In some implementations, the memory device includes an additional antiferromagnetic layer configured to provide exchange pinning to the magnetization direction of the flux compensation layer. In some implementations, the flux compensation layer is between the additional antiferromagnetic layer and the reference layer.

In some implementations, the memory device includes a non-magnetic interlayer disposed between the spin polarization layer and the antiferromagnetic layer. The non-magnetic interlayer includes one or both of a non-magnetic conducting layer and a thin tunnel barrier.

In some implementations, the memory device includes a non-magnetic interlayer disposed between the ferromagnetic layer and the storage layer. The non-magnetic interlayer includes one or both of a non-magnetic conducting layer and a thin tunnel barrier.

In some implementations, the memory device includes a conducting electrode disposed adjacent to the spin polarization layer for contacting a current source for the stack.

In some implementations, the antiferromagnetic layer includes a mechanism configured to maintain a plurality of antiferromagnetic coupled spins approximately antiparallel to each other within a plane of the antiferromagnetic layer. The plurality of antiferromagnetic coupled spins are configured to be aligned either parallel or antiparallel to the magnetization direction of the ferromagnetic layer. In some implementations, the antiferromagnetic layer includes a magnetic anisotropy configured to maintain the plurality of antiferromagnetic coupled spins approximately within the plane of the antiferromagnetic layer.

In some implementations, the ferromagnetic layer includes a mechanism to ensure that a magnetization of the ferromagnetic layer is exchange coupled to one set of the plurality of antiferromagnetic coupled spins of the antiferromagnetic layer at an interface between the ferromagnetic layer and antiferromagnetic layer.

In some implementations, the spin polarization layer comprises one or more of a Co/Ni, a Co/Pt, or a Co/Cu multilayer superlattice, or one or more of Co, Fe, or CoFeB thin film layers coupled to an underlayer material.

In some implementations, the memory device includes an additional antiferromagnetic layer disposed between an electric contact and the spin polarization layer. The additional antiferromagnetic layer is configured to pin a magnetization of the spin polarization layer.

In some implementations, the memory device includes one or more underlayers disposed adjacent to the spin polarization layer, the one or more underlayers configured to facilitate a crystalline texture for the spin polarization layer and increase a magnitude of the magnetic anisotropy of the spin polarization layer.

A magnetic-electric oscillator includes a plurality of layers forming a stack. The plurality of layers include an electrode for receiving a current from a current source for the stack, a spin polarization layer configured to receive the current from the electrode and comprising a perpendicular magnetic anisotropy approximately normal to a plane of the spin polarization layer, the spin polarization layer further configured to polarize the current, an antiferromagnetic layer, a ferromagnetic layer configured to be exchange biased by the antiferromagnetic layer and receive the polarized current from the spin polarization layer, a reference layer comprising a reference magnetization that is approximately within a plane of the reference layer, and a conductive metal layer forming one of a magnetoresistive trilayer with the ferromagnetic layer and the reference layer or a magnetic tunnel junction with the ferromagnetic layer and the reference layer. The ferromagnetic layer, in response to the current applied to the plurality of layers forming the stack, is configured to include a magnetization that rotates at a frequency that is proportional to an amount of the current received from the current source.

In some implementations, the magnetic-electric oscillator includes a flux compensation layer including a magnetization direction configured to be approximately antiparallel to the reference magnetization of the reference layer. In some implementations, the magnetic-electric oscillator includes a metallic interlayer disposed between the reference layer and the flux compensation layer. The metallic interlayer is configured to induce an antiparallel exchange coupling between the reference magnetization and the magnetization direction of the flux compensation layer.

In some implementations, the magnetic-electric oscillator includes an additional antiferromagnetic layer configured to provide an exchange bias to the magnetization direction of the flux compensation layer.

In some implementations, a resistance of the stack oscillates in magnitude at the frequency when the magnetization of the ferromagnetic layer rotates. In some implementations, the frequency is greater than 1 gigahertz.

In some implementations, a memory device for a computing system includes a plurality of layers forming a stack. The plurality of layers include a first electrode configured to receive current for the stack from a read/write line of the memory device. The plurality of layers include a spin polarization layer adjacent to the first electrode and configured to receive the current from the first electrode, the spin polarization layer having a magnetic anisotropy approximately perpendicular to a plane of the spin polarization layer. The plurality of layers include an antiferromagnetic layer comprising an antiferromagnetic material and configured to receive the current from the spin polarization layer. The plurality of layers include a non-magnetic interlayer disposed between the spin polarization layer and the antiferromagnetic layer, the non-magnetic interlayer comprising a non-magnetic conducting material. The plurality of layers include a ferromagnetic layer that is exchange coupled to the antiferromagnetic layer, wherein the antiferromagnetic layer is between the ferromagnetic layer and the non-magnetic interlayer, the ferromagnetic layer configured to receive the current from the antiferromagnetic layer. The plurality of layers include a storage layer having a magnetization direction that indicates a memory state of the storage layer, the memory state configured to be reversed in response to receiving the current from the ferromagnetic layer. The plurality of layers include a reference layer having a magnetic anisotropy approximately perpendicular to a plane of the reference layer, the reference layer configured to provide a magnetic direction reference for the magnetization direction of the storage layer and causing a resistance difference between two opposite magnetization directions of the storage layer. The plurality of layers include a metallic non-magnetic conducting layer disposed between the storage layer and the reference layer to form a magnetic tunnel junction. The plurality of layers include a flux compensation layer having a magnetization direction that is approximately opposite to the magnetization direction of the reference layer, the flux compensation layer configured to compensate for stray magnetic flux from the reference layer. The plurality of layers include a pinning layer configured to provide exchange pinning to the magnetization direction of the flux compensation layer. The plurality of layers include a second electrode configured to return current from the stack to the memory device.

In some implementations, the current is less than 50 μA. In some implementations, a planar size of each layer of the plurality of layers of the stack is between approximately 10 nm by 10 nm and approximately 20 nm by 20 nm.

In some implementations, the first electrode and second electrode each comprise one of Cu, CuNi, Pt, and Ir. In some implementations, the spin polarization layer comprises one of Co/Pt multilayer, a Co/Ni multilayer, a Co/Pd multilayer, or FePt-L10. In some implementations, the non-magnetic interlayer comprises one of Cu, Cr, or MgO. In some implementations, the antiferromagnetic layer comprises one of IrMn, PdMn, or FeMn. In some implementations, the ferromagnetic layer comprises one of Co, Fe, FeCo, or NiFe. In some implementations, the storage layer comprises FeCoB. In some implementations, the metallic non-magnetic conducting layer comprises MgO. In some implementations, the reference layer comprises FeCoB. In some implementations, the flux compensation layer comprises one of FeCoB, or a Co/Pt multilayer. In some implementations, the pinning layer comprises IrMn.

In some implementations, the magnetic multilayer stack comprises a perpendicularly magnetized spin polarization layer, which is furthest away from the storage layer, a conductive non-magnetic interlayer; an antiferromagnetic material layer which is separated from the spin polarization layer by the non-magnetic conductive interlayer; a ferromagnetic layer that is exchange coupled to the antiferromagnetic layer, in preference to one parallel set of the spins; and a non-magnetic conductive layer, or a thin insulating layer as a tunnel barrier, which is adjacent to the ferromagnetic free layer (or referred to as the storage layer) of the memory element. The other side of the storage layer is in adjacent to a tunnel barrier, usually a thin MgO layer. The storage layer is an apart of the conventional spin transfer torque magnetic (or magnetoresistive) random access memory (MRAM).

The resonant STT memory device can form a memory element in a larger memory device having a plurality of the resonant STT memory devices. The memory element can be configured to store a bit of data for the memory device. Using a plurality of resonant STT memory devices as memory elements in a memory device reduces the power consumption required for operating the memory device. Additionally, because the resonant STT memory device requires less current and thus requires smaller associated transistors, a size of the memory device can be reduced.

The details of one or more embodiments of the resonance rotating spin-transfer torque memory device are set forth in the accompanying drawings and the description below. Other features, objects, and advantages of the resonance rotating spin-transfer torque memory device will be apparent from the description and drawings, and from the claims.

DETAILED DESCRIPTION

This document describes a spin transfer torque (STT) magnetoresistive random access memory (MRAM) device that provides for a reduction of switching current threshold and reduced switching time when compared to conventional devices.

In conventional STT MRAM, a memory element consists of a magnetic free layer (also referred as storage layer) and a reference layer, both with perpendicular magnetic anisotropy, sandwiching a magnetic tunnel barrier. The spin polarized electron current in the storage layer results in a spin transfer torque on the storage layer magnetization. Such spin transfer torque is anti-damping in nature and provides the mechanism of storage layer magnetization switching. However, the angular dependence characteristics of the spin transfer torque on the relative orientation between the magnetizations of free and reference layers give rise to a switching asymmetry: the switching current threshold for reversing storage layer magnetization from parallel (relative to the magnetization of the reference layer) to antiparallel (e.g., P to AP), magnetization configuration is significantly higher than that of the antiparallel to parallel (e.g., AP to P) switching. The higher of the two switching current magnitudes determines the size of the programming transistors which controls the foot print of the basic memory cell, because transistor size limits a maximum operating current for the transistor. Thus, reducing the current magnitude of the P to AP permits lower operating currents for the STT memory device and smaller transistor size for the STT memory device. This enables the STT memory device to use less power, have greater storage density, etc.

The STT memory devices described herein comprise an additional thin film stack and operate with a reduced P to AP switching current. The additional thin film stack that is added to the conventional STT memory element significantly reduces the switching current threshold, particularly for the P to AP state switching. The function of this added stack is to provide an additional rotating spin transfer torque to the storage layer on the opposite side of the reference layer to resonant with the magnetization precession of the storage layer during switching.

Figure 1A:
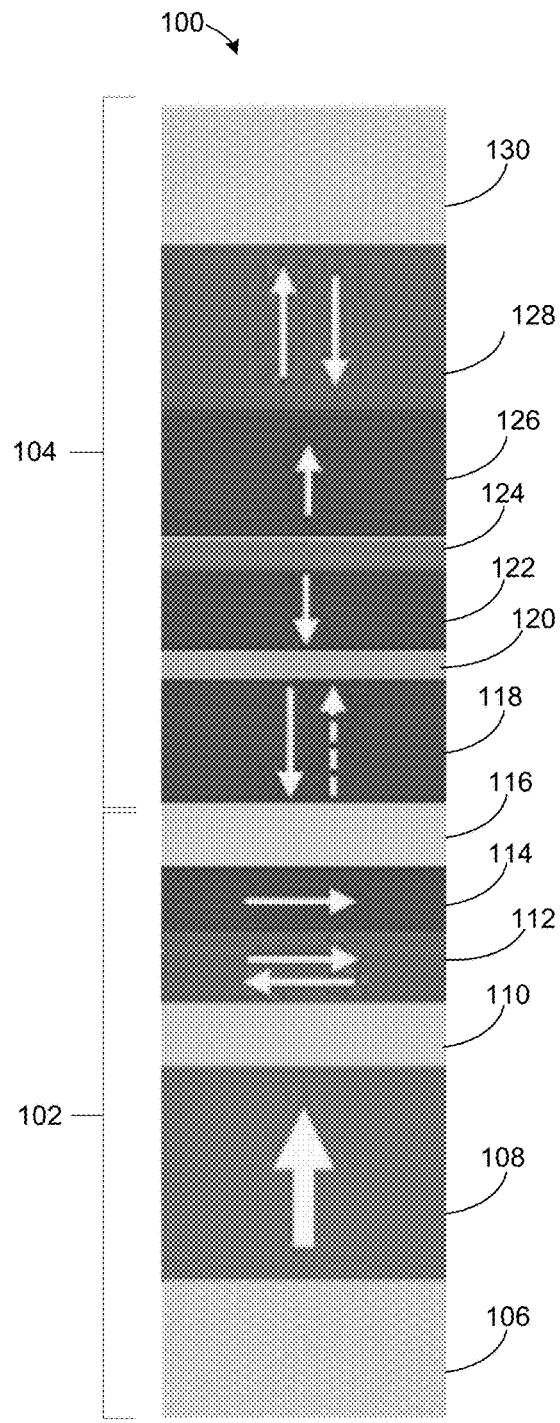
FIGS. 1A-1B show diagrams of example resonant STT memory device layers.
Figure 1B:
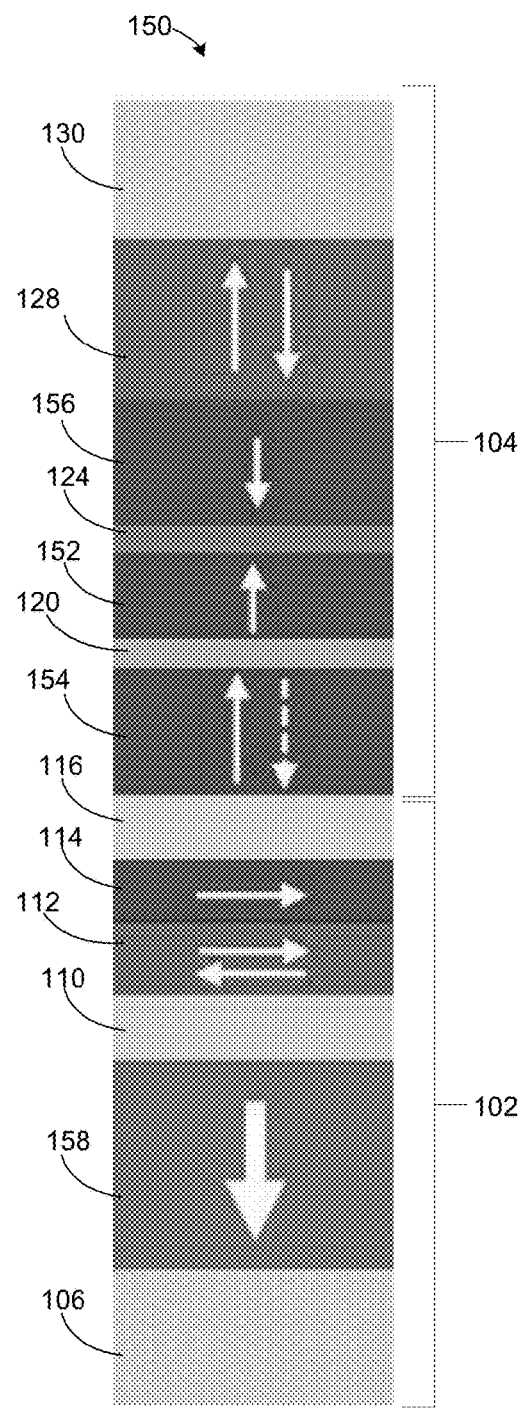

FIGS. 1A-1B show examples of resonance rotating spin-transfer torque (STT) memory devices 100, 150. The resonant STT memory device 100 of FIG. 1A includes a magnetic multilayer structure 102 that under an electric current flow, produces a rotating spin polarization in a current being passed through the STT memory device 100. The magnetic multilayer structure can be referred to as the rotating spin polarizer (RSP) 102. The RSP 102 is combined with a storage layer 118 (e.g., free layer) of a magnetic memory element 104. When current passes through the STT memory device 100, the rotating spin polarization in the storage layer 118 yields a rotating spin transfer torque to the local magnetic moment in addition to the conventional spin transfer torque or magnetic field for switching. The addition of this rotating spin transfer torque reduces the switching time, and/or the switching current threshold for the switching of the storage layer magnetization, provided the rotating frequency includes the proper frequency regime, as described below.

The RSP 102 of the resonant STT memory device 100 includes a metal electrode 106, a perpendicular spin polarization layer 108, a metal interlayer 110, a layer of antiferromagnetic material 112, a thin ferromagnetic layer 114 exchange biased by the antiferromagnetic layer 112, and a metal interlayer 116. This magnetic multilayer structure 102 is interfaced with a storage layer 118 (e.g., free layer) of the magnetic memory element 104. The added antiferromagnet-based stack 102 is used to generate a rotating spin transfer torque in the storage layer 118 of the memory element 104 during the current-driven magnetization switching process. The electrode 106 can include an electric contact or electric lead. The perpendicular spin polarization layer 108 includes a perpendicular anisotropy and spontaneous perpendicular magnetization. The metal interlayers 110, 116 include a non-magnetic layer that can be either a conducting metal layer or an electrically insulating layer, such as a tunnel barrier. The antiferromagnetic layer 112 includes a film layer of antiferromagnetic material. Antiparallel spins are approximately co-linearly aligned with one another. The ferromagnetic layer 112 is exchange coupled to the antiferromagnetic layer 112. The exchange coupling is biased towards coupling to one set of the parallel spins in the antiferromagnetic layer and less biased towards coupling to the parallel spins of the other set of parallel spins. The ferromagnetic layer 114 polarizes the electron spins of electric current to generate a rotating spin transfer torque in the storage layer 118. The ferromagnetic layer 114 can also be referred to as an in-plane spin polarization layer. The ferromagnetic layer 114 can also be a synthetic antiferromagnetic tri-layer formed by two ferromagnetic layers sandwiching a metal layer that enables strong antiparallel coupling between the two ferromagnetic layers. The interlayer 116, similar to interlayer 110, can be a conducting metallic layer or a thin tunnel barrier layer.

The magnetic memory element 104 includes the storage layer 118 of the memory element. The storage layer 118 is usually a ferromagnetic layer with perpendicular anisotropy. The dashed arrow 132 indicates a complementary memory state in which the magnetization of the storage layer is the opposite. The magnetic memory element 104 includes a reference layer 122. The reference layer 122 is typically a ferromagnetic layer. The magnetic memory element 104 includes a tunnel barrier layer 120. The tunnel barrier layer 120, the storage layer 118, and a reference layer 122 form a magnetic tunnel junction. The reference layer 122 is a part of synthetic antiferromagnets formed by the storage layer 118, the reference layer 122, and a metallic interlayer 124. The magnetic interlayer facilitates antiparallel coupling between the two adjacent ferromagnetic layers including the reference layer 122 and a flux compensation layer 126. The flux compensation layer 126, also referred to as the pinned layer, typically includes a ferromagnetic layer. The flux compensation layer 126 provides flux compensation to the reference layer 122, to reduce or eliminate stray magnetic field from the reference layer 122. An antiferromagnetic pinning layer 128 provides exchange pinning to the magnetization of the flux compensation layer 126. The magnetic memory element 104 can also include a conducting electrode 130 to cap the stack.

The layers of the resonant STT memory device 100 can be formed from various materials. For example, the electrodes 106, 130 can include one or more of Cu, CuNi, Pt, and Ir. In another example, the spin polarization layer 108 can include one or more of a Co/Pt multilayer, a Co/Ni multilayer, a Co/Pd multilayer, and FePt-L10. In another example, the interlayers 110, 116 include one or more of Cu, Cr, and MgO. In an example, the antiferromagnetic layer 112 includes one or more of IrMn, PdMn, and FeMn. In one example, the ferromagnetic layer 114 includes one or more of Co, Fe, FeCo, and NiFe. In one example, the storage layer 118 includes FeCoB. In one example, the tunnel barrier layer includes MgO. In one example, the reference layer 122 includes FeCoB. In one example, the metallic interlayer 124 includes Ru. In one example, the flux compensation layer includes one or more of FeCoB, and a Co/Pt multilayer. In one example, the antiferromagnetic pinning layer 128 includes IrMn.

Resonant STT memory devices 100, 150 represent different examples regarding the actual magnetization orientation of the perpendicular polarization layer 108 and the magnetization orientation of the reference layer 122 and the flux compensation layer 126. Resonant STT memory device 150 of FIG. 1B is similar to resonant STT memory device 100, except the orientation of the storage layer 154 is reversed in polarity relative to storage layer 118 under the same conditions. For resonant STT memory device 150, the reverse magnetic orientations of reference layer 152 and flux compensation layer 156, combined with the reverse magnetization orientation of the spin polarization layer 158 causes the magnetic orientation of the storage layer 154 to be reversed relative to storage layer 118. In both designs, the magnetization orientation of the spin polarization layer 108, 158 and the flux compensation layers 126, 156 are in the same direction. Such magnetization configurations are designed for significant reduction of switching current threshold for switching from P to AP state, as the detailed mechanisms are described below.

The magnetization dynamics of all the magnetic layers in the designed device shown in FIG. 1A-1B are modeled and simulated with utilization of the coupled Landau-Lifshitz-Gilbert gyromagnetic equations with inclusion of spin transfer torque arising from spin polarized current:

$$\frac{d\hat{m}}{dt} = -\gamma \cdot \hat{m} \times \vec{H} + \alpha \cdot \hat{m} \times \frac{d\hat{m}}{dt} + \eta \cdot \hat{m} \times \hat{p} \times \hat{m} \qquad \text{Eq. (1)}$$

where $\vec{H}$ is the effective field defined as $$\vec{H} = -\frac{\partial E}{\partial \vec{M}}$$

where E is the total energy of the macro-spin (with unit vector $\hat{m}$) including magnetocrystalline anisotropy energy, magnetostatic energy, and exchange energy. The antiferromagnetic layer is modeled as two macro-spins with antiferromagnetic exchange coupling. The magnetization of the rest magnetic layers is assumed to be single domain such that a single macro-spin is used to represent the layer magnetization. $\gamma$ is the gyromagnetic ratio, $\alpha$ is the Gilbert damping constant, where, $\alpha=0.01$ for one or more layers of the stack. $\hat{p}$ is the polarization unit vector of the spin current through the layer and the spin transfer torque coefficient for the layer is $$\eta = \frac{\hbar}{\gamma e} \frac{JP}{M_s \delta} \cdot g(\theta) \qquad \text{Eq. (2)}$$

where J is the current density, P is the polarization factor of the spin current, Ms is the saturation magnetization of the layer and $g(\theta)$ is the angular dependence of the spin transfer depending on whether the interlayer is metallic or a tunnel barrier for the magnetic tunnel junction.

A typical size of the resonant STT memory device is approximately 20 nanometers (nm) by 20 nanometers (nm). For all the simulation results presented herein, the resonant STT memory device is 400 nm² in area. This geometry and dimension is also used as an example for calculating the AF-F only structure. However, other sizes of the resonant STT memory device cross-section are possible, and the resonant STT memory device can be scaled up as needed or down to as small as 10 nm².

The magnetostatic stray field that is induced from the exchange biased magnetic layer 114 below the storage layer 118 is purposely neglected to clearly show the effect of rotating spin transfer torque. The perpendicular spin polarization layer 108 is mimicked by the generation of the perpendicularly spin polarization in the current through the antiferromagnetic layer 112 with a polarization factor of $P_{perp}=0.5$. The reference synthetic antiferromagnet tri-layer, formed by layers 122, 124, 126 adjacent to the tunnel barrier 120 of the magnetic tunnel junction is typically flux-matched (or approximately so) with negligible stray field. Both the storage layer 118 and the reference layer 122 next to the tunnel barrier 122 of the magnetic tunnel junction formed by layers 118, 120, 122 have the same polarization factor of $P_{MTJ}=0.5$. The saturation magnetization of the storage layer 118 and the exchange biased layer 114 all have an Ms=1000 emu/cm³ with thickness of $\delta=2$ nm for both layers (however, other thicknesses and $M_s$ values can be used, and are defined in the examples below if different from these example values). The effective perpendicular anisotropy field, $H_k$–4πMs=7.3 kOe, which corresponds to an energy barrier of $E_b \approx 70$ $k_B T$ at room temperature. The polarization factor of the exchange bias layer 114 is $P_{exb}=0.65$ with zero magnetocrystalline anisotropy. Thermal agitation is also included in the modeling assuming room temperature of T=300 K with introduction of random field following previously developed models.

During programming of the memory bit, a write current pulse is injected to the resonant STT memory device 100 and the direction of the current will depend on whether a "1" or "0" will be programmed. Considering the case that electron current flows from bottom to top for the resonant STT memory device 100, the bottom perpendicularly magnetized layer 108 spin polarizes the current in the antiferromagnetic layer 114.

For the resonant STT memory device 100, to switch the magnetization of the storage layer 118, from pointing "down" to pointing "up", the electron current flows from the bottom to top. From pointing "up" to pointing "down", the electron current flows in the opposite direction. In the alternative configuration 150 shown in FIG. 1B, the magnetization of the perpendicular spin polarization layer is reversed. In order to have the correct chirality of the rotating spin transfer torque to "assist" the magnetization switching of the storage layer, the magnetization of the reference layer, the flux compensation layer (pinned layer) are also need to be reversed accordingly as shown in the figure.

The ferromagnetic layer 114, is exchange coupled to the antiferromagnetic spins at the interface with preference to one parallel set of the spins, often referred to as the exchange bias. Assuming the exchange bias is sufficiently large, the magnetization of the ferromagnetic layer 114 follows the spin rotation in the antiferromagnetic layer 112. The rotation of the magnetization of the ferromagnetic layer 114 results in spin polarization of the current flowing in the storage layer 118 (free layer) to facilitate (or to assist) the switching of the magnetization of the storage layer. The chirality of the spin polarization rotation is such that it matches the chirality of magnetization precession prior to the magnetization switching in the storage layer 118.

The rotating frequency of the antiferromagnetic spins is linearly proportional to the ratio of the injection current amplitude and the number of antiferromagnetic spins in the layer, i.e. the spin torque amplitude on the antiferromagnetic spins. To provide most efficient facilitation or assisting for the storage magnetization switching, the rotating frequency should match the ferromagnetic resonance frequency of the storage layer 118. When the rotating spin transfer torque is at right frequency regime, the spin transfer torque on the magnetization of the storage layer 118 facilitates the precession of the magnetization by pumping energy in to the magnetic system and increasing the precessional angle. In the condition that the energy pumping rate exceeds the dissipation rate, with sufficient time, magnetization reversal will occurs. The rotating spin transfer torque utilizes the ferromagnetic resonance to assist/facilitate the magnetization switching of the storage layer 118.

Figure 2A:
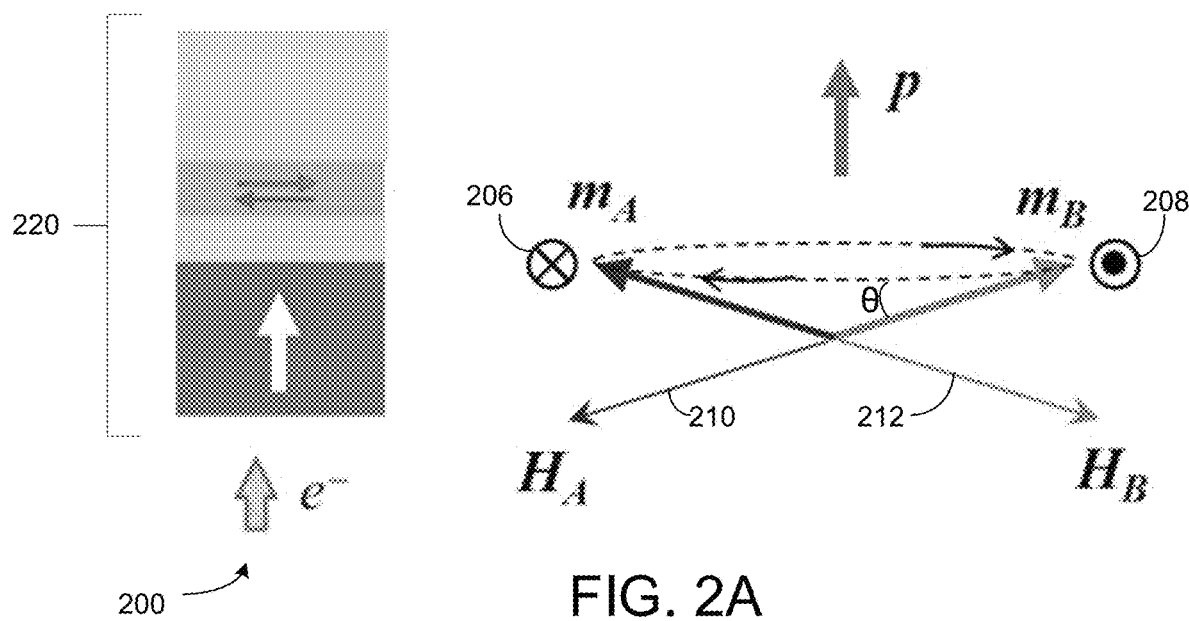
FIGS. 2A-2B show diagrams of current flow through example antiferromagnetic/ferromagnetic (AF/F) structures.
Figure 2B:
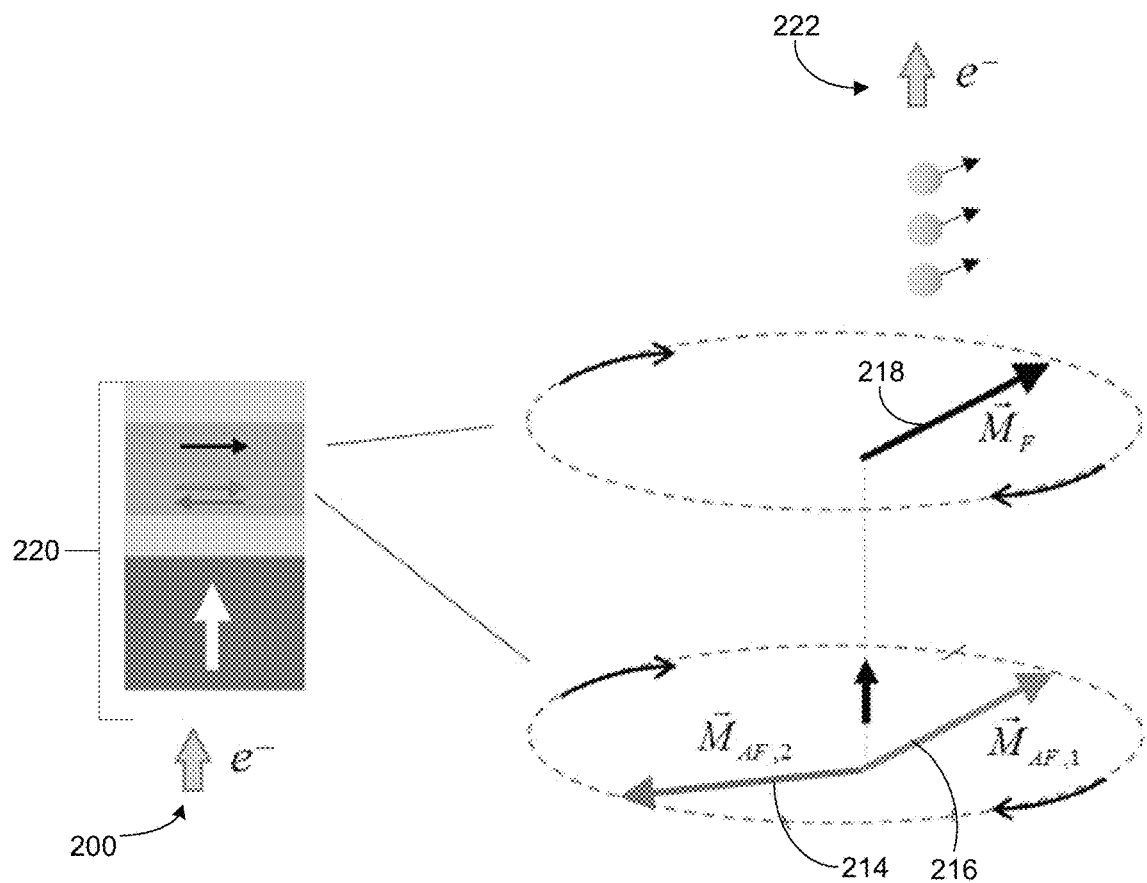

FIGS. 2A-2B show a side view and a perspective view, respectively, of a perpendicularly spin polarized current 200 flowing through an antiferromagnetic layer 112 of an antiferromagnetic/ferromagnetic (AF/F) structure 220. The two sets of antiferromagnetic coupled spins, $m_A$ and $m_B$, are collinear in nature in the absence of external force. The spin transfer torque arises the spin polarized current forces the two sets of spins to be slightly canted with respect to each other. The spin canting causes exchange field on a set of the spins and consequently the set of the spins would to precess around the corresponding exchange field. As a result, the slightly canted antiferromagnetic spins 210, 212 precess around the current spin polarization direction according to the left-hand rule: put the thumb along the spin polarization direction, the fingers would indicate the spin precessional chirality (shown by field lines 206, 208).

Eq. (1) can be rewritten in the following form:

$$\frac{d\hat{m}}{dt} = -\frac{\gamma}{1-\alpha^2}\hat{m}\times\left(\vec{H}-\frac{\alpha\eta}{\gamma}\hat{p}\right)-\frac{\alpha\gamma}{1+\alpha^2}\hat{m}\times\hat{m}\times\left(\vec{H}+\frac{\eta}{\alpha\gamma}\hat{p}\right) \quad \text{Eq. (3)}$$

A spin transfer torque is facilitated spin precession in the antiferromagnetic/ferromagnetic (AF/F) structure 220, as shown in FIG. 2A. At steady state, a damping term decays to zero. The damping torque (for motion towards the effective magnetic field) balances with the anti-damping spin transfer torque:

$$\hat{m}\times\vec{H} = -\frac{\eta}{\alpha\gamma}\hat{m}\times\hat{p} \quad \text{Eq. (4)}$$

Under this condition, the Eq. (3) reduces to a simple precession equation for the spins in the antiferromagnet:

$$\frac{d\hat{m}}{dt} = \frac{\eta}{\alpha}\cdot\hat{m}\times\hat{p} \quad \text{Eq. (5)}$$

In contrast to the electron spin precession in ferromagnetic resonance, the sign here is positive instead, indicating precession follows the left-hand rule with respect to the spin polarization direction. The angular frequency of the spin precession in the antiferromagnet, assuming spin precession are confined in the film plane, is shown as Eq. (6):

$$\omega = \frac{\eta}{\alpha} = \frac{\gamma}{\alpha}\cdot\frac{\hbar}{e}\cdot\frac{JP}{(M_{S,AF}^\uparrow+M_{S,AF}^\downarrow)\cdot\delta_{AF}} \quad \text{Eq. (6)}$$

where $\alpha$, again, is the Gilbert damping constant in Eq. (1), and $(M_{S,AF}^\uparrow+M_{S,AF}^\downarrow)\cdot\delta_{AF}$ is the sum of the magnetic moments density of the two sets of spins in the antiferromagnet.

FIG. 2B. is an illustration showing how a rotating spin transfer torque is generated. The current facilitated spin precession in the antiferromagnetic layer 112 drives the magnetization of the ferromagnetic layer 114 to rotate synchronously via an exchange bias. The electron current flow 222 out of the top of an antiferromagnetic/ferromagnetic (AF/F) structure 220 would be polarized by the magnetization of the exchange biased ferromagnetic layer, thereby, generating spin current with rotating polarization.

FIG. 2B illustrates how the rotating spin angular momentum co is generated inside the storage layer 118. The perpendicular spin polarization layer 108 generates perpendicular polarized current in the antiferromagnetic layer 112. The created spin transfer torque on the antiparallel-coupled spins 214, 216 yield spin canting towards the spin polarization direction of the current. The canting-resulted exchange field causes the antiparallel-coupled spins to precess around the current spin polarization direction (with a left-hand rule). The spin precession of the spins in the antiferromagnetic material 112 brings the magnetization 218 of the exchange-coupled ferromagnetic layer 114 to rotate along with them through the interfacial exchange coupling between the antiferromagnetic layer 112 and the ferromagnetic layer 114. Thus, the spin polarization of the current on the side of the storage layer 118 next to the exchange-biased ferromagnetic layer 114 follows the magnetization rotation of the exchange-biased ferromagnetic layer 114. The rotating spin polarization will generate a rotating spin transfer torque on the storage layer magnetization.

Some of Mn-based antiferromagnet with $L1_0$ ordering, such as binary MnPd and MnIr, exhibit uniaxial anisotropy with strong negative anisotropy energy constant, i.e. $K_u<0$. The ordering direction becomes hard axis with an easy plane perpendicular to it. This type of antiferromagnetic thin film could be used to confine the spin precession within the film plane provided appropriate crystalline texture.

For a given antiferromagnetic layer, the spin precessional frequency is proportional to the ratio of current density and materials Gilbert damping constant, a. Low value of the damping constant could be important for generating desired operating frequency at practical current densities.

Many other classes of antiferromagnetic materials are not collinear, e.g., with antiferromagnetically coupled spins on a triangular lattice. Even though the spin configuration is in "frustration", steady spin precession can still be generated via spin transfer torque.

Figure 3:
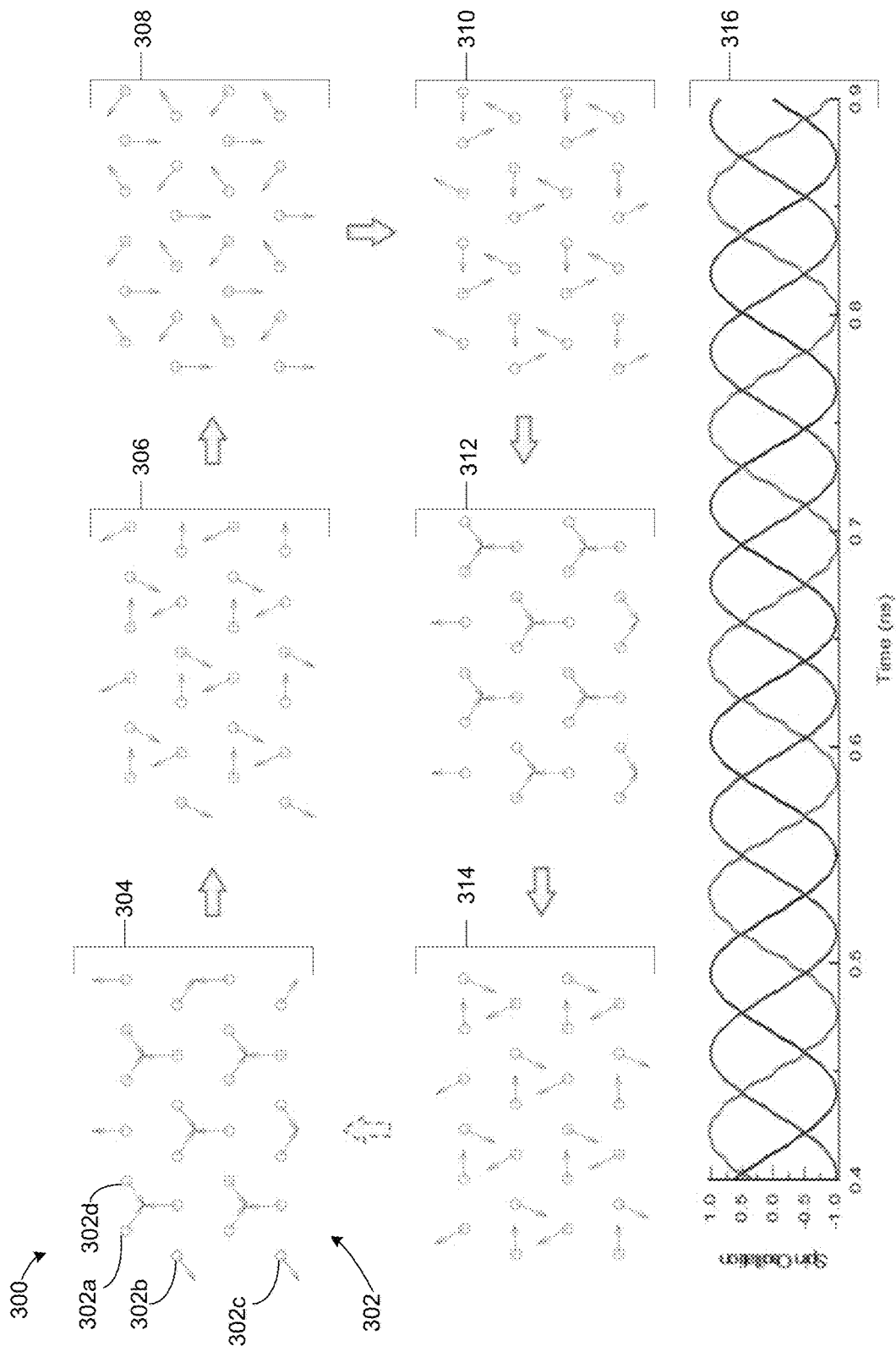
FIG. 3 shows a simulation of the spin precession for antiferromagnetic coupled spins on a 2D triangular lattice.

FIG. 3 shows a simulation 300 of the spin precession for antiferromagnetic coupled spins on a 2D triangular lattice, excited by a perpendicularly spin polarized current using Eq. (1). Specifically for this case, 24 spins that are collectively labeled as 302 (four of which are labeled 302a, 302b, 302c, and 302d, respectively) with periodical boundary conditions are used in the calculation with identical atomic antiferromagnetic coupling energy assigned to one or more pairs of adjacent spins, assuming a Neel temperature of $T_N=800$ K. Steady spin precessions are obtained with three sets of parallel spins. The spin orientation between one or more sets maintains at 120° angle as the spin configurations at different phase of rotation shown in FIG. 3. The spins 302 are shown at different moments in time at stages 304, 306, 308, 310, 312, and 314.

The spins rotate counter-clock wise and arrows indicate time evolution. The three curves in the bottom graph 316 represent the spin projection of three sets of parallel spins. For a triangular lattice, such as that in the example of FIG. 3, the relative angle between the set of spins are maintained at 120°. However, for other lattices, the relative angles between the set of spins can vary to other values (e.g., 60°, 90°, etc.).

An advantage of using antiferromagnetic thin film layer for spin current excited oscillation in comparison with using a ferromagnetic layer relates to generation of the spin precession, as described here. For a ferromagnetic layer, the oscillation frequency is determined by either the shape anisotropy field, or the intrinsic crystalline anisotropy field, usually with perpendicular easy axis. The oscillation frequency is $\omega=\gamma H_{k,eff}\cos\theta$ with $\theta$ being the magnetization angle with respect to the film normal. The precessional frequency vanishes when the magnetization is completely in the film plane. For generating spin precession in the 10s of giga-hertz regime, the magnetization needs to have significant perpendicular component and the highest precessional frequency would be limited by the effective anisotropy field, or saturation magnetization, of the material. In contrast, for an antiferromagnetic thin film, the equivalent exchange coupling between adjacent spins is substantially larger, on the order of 100T, which corresponds to f=2.8 THz. For precession frequency below 100 GHz, the spin canting angle θ illustrated in FIG. 2A would still be very small (e.g., less than 15 degrees).

Using two antiparallel coupled macro-spins to describe the antiferromagnetic layer is an approximation, considering the polycrystalline nature of most practically antiferromagnetic thin films. In those materials, there will be antiferromagnetic domains with randomly oriented principle axes. However, the multi-domain configurations do not likely to alter (qualitatively) the operation of the resonant STT memory device. This is because the spin transfer torque facilitated precession has no dependence on the phase of the spin rotation.

When a ferromagnetic layer is placed on top of the antiferromagnetic layer 112 in the spin torque oscillator described above, the magnetization of the ferromagnetic layer 114 can be preferentially exchange coupled to only one of the two spin sets in the antiferromagnet. When the coupling is sufficiently strong, spin transfer torque excited spin precession in the antiferromagnet will bring along the magnetization of the ferromagnetic layer to rotate together. The current through the ferromagnetic layer 114 has a rotating spin polarization following the magnetization, as illustrated in FIG. 2B. This entire structure for generating the rotating in-plane spin polarization is referred to as the antiferromagnetic/ferromagnetic (AF/F) structure 220.

Using Eq. (1), simulations are performed for spin dynamics in the AF/F structure 220 with a steady current flow. For the antiferromagnetic layer, the spin transfer torque from perpendicularly polarized spin current is equally divided for the two antiparallel coupled macro-spins. The coupling strength between the two macro-spins is approximately $J_{AF}=k_B T_N/(2z)$ with z=4 and $T_N$=800 K. This corresponds to an effective antiferromagnetic exchange field on the two spins on the order of $J_{AF} \cdot \Delta\theta/\mu_B$ where $\Delta\theta$ is the canting angle away from the antiparallel axis and $\mu_B$ is the Bohr magneton. The antiferromagnetic-ferromagnetic (AF-F) interfacial coupling of the exchange bias is on only one of the two antiferromagnetic macro-spins with coupling energy of $E_{bias}$=1.0 erg/cm².

Figure 4:
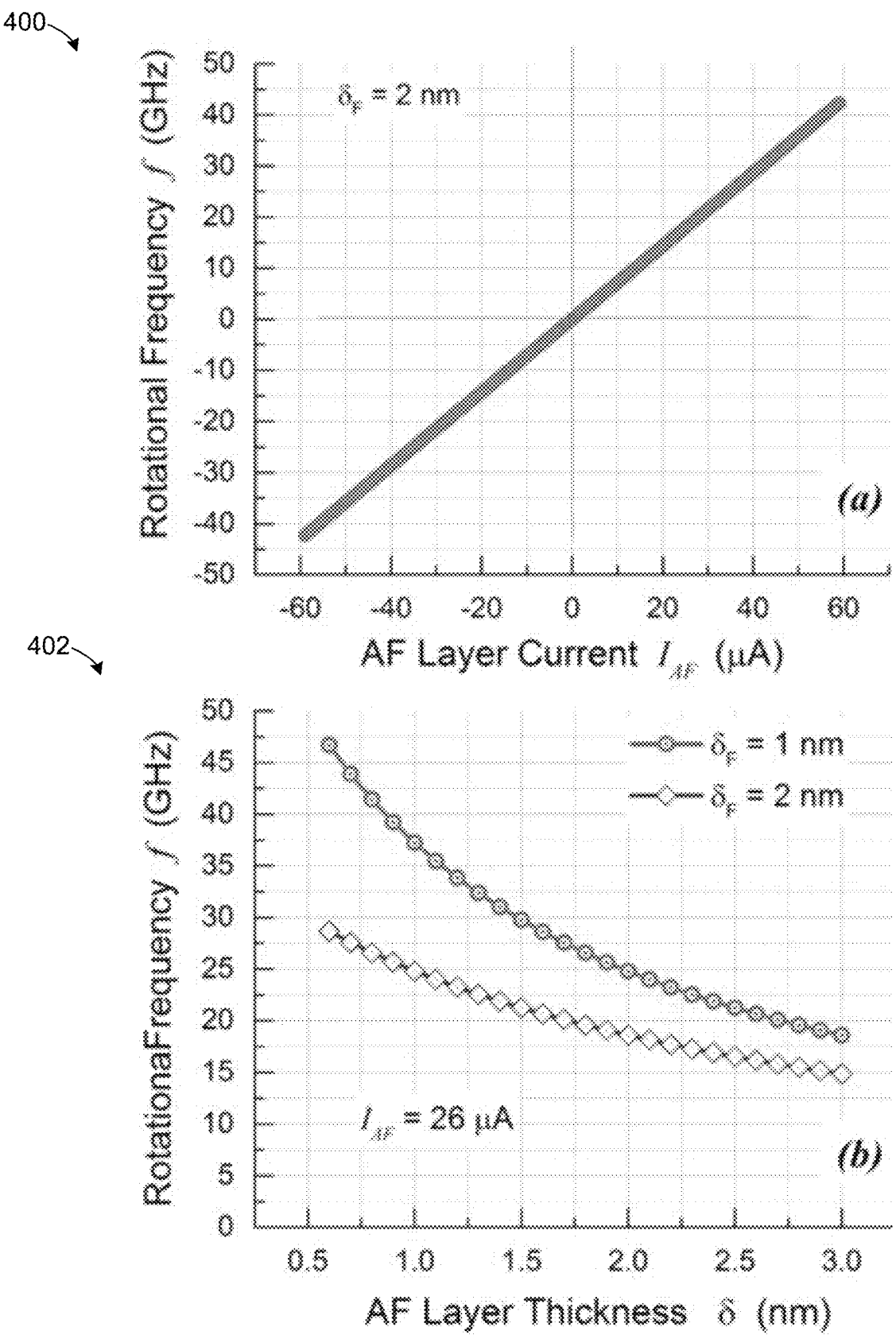
FIG. 4 shows graphs illustrating a relationship between a frequency of the simulated spin transfer facilitated spin precession and current in the antiferromagnetic layer of the resonant STT memory devices of FIGS. 1A-1B.

FIG. 4 includes graphs 400, 402. Graph 400 shows an example of a relationship between the frequency of the simulated spin transfer facilitated spin precession and current in the antiferromagnetic layer 112, including a simulated spin precession frequency in a collinear antiferromagnetic film as a function of current. Graph 402 shows an example relationship between the frequency of the simulated spin transfer facilitated spin precession and layer thickness of the antiferromagnetic layer 112, including the simulated spin precessional frequency as a function of antiferromagnetic layer thickness. For the graphs 400, 402, the size of the resonant STT memory device simulated is 400 nm². At a particular coupling energy density, the spins of the antiferromagnet and the magnetization of the exchange-biased ferromagnet rotate synchronously. In this calculation, no spin transfer is included for the ferromagnetic layer 114. However, since the ferromagnetic layer 114 is coupled to the antiferromagnetic layer 112, the ferromagnetic layer behaves like a "load" for the antiferromagnetic spin torque oscillator, resulting in a lower precessional frequency for the AF/F coupled system. When the magnetic moment of the coupled ferromagnetic layer 114 is relatively greater, the rotational frequency of the AF/F coupled system is relatively lower, as shown in graph 402. In these calculations, a perpendicular uniaxial anisotropy includes a negative anisotropy energy constant valued at $K_u$=−2×10⁷ erg/cm³ for the antiferromagnetic layer 112. The strong easy plane created confines the spins to precess approximately within the film plane. Because of the spin in-plane confinement, the precessional frequency is not substantially affected by the value of $K_u$.

For a tightly coupled AF/F system, it can be derived that the spin transfer excited magnetization precession is given by the following expression:

$$\omega = \frac{\gamma}{\alpha_{eff}} \cdot \frac{\hbar}{e} \cdot \frac{J \cdot P_{AF}}{(M_S^\uparrow + M_S^\uparrow) \cdot \delta_{AF} + M_{S,F} \cdot \delta_F} \quad \text{Eq. (7)}$$

where $\alpha_{eff}$ is the effective damping constant of the system. Because the rotational frequency is inversely proportional to the damping constant, the material systems include sufficiently low damping constants for a targeted precessional frequency range.

The effect of the additional rotating spin transfer torque on the resonant STT memory device 100 storage layer 118 magnetization switching is described here. Switching includes a reversal from a first state in which the magnetizations of the storage layer 118 and reference layer 122 are parallel to each other to a second state in which the magnetizations of the storage layer 118 and reference layer 122 are antiparallel to each other, i.e. P to AP switching. As described above, for conventional STT MRAM devices, the current threshold for the P to AP switching is significantly higher than that of AP to P switching due to the magnetization angular dependence of the spin transfer torque.

To model the effect of the addition of the in-plane rotating spin transfer torque, a storage layer 118 that is approximately 2 nm thick is divided into two 1 nm-thick ferromagnetic tight-coupled sub-layers whose magnetization are modeled by two ferromagnetically-coupled macro-spins. The sub-layer next to the tunnel barrier experiences the spin transfer torque arising from the spin polarization by the reference layer 122 through the tunnel barrier layer 120. The sub-layer on the side of AF/F oscillator experiences the rotating spin transfer torque.

Figure 5:
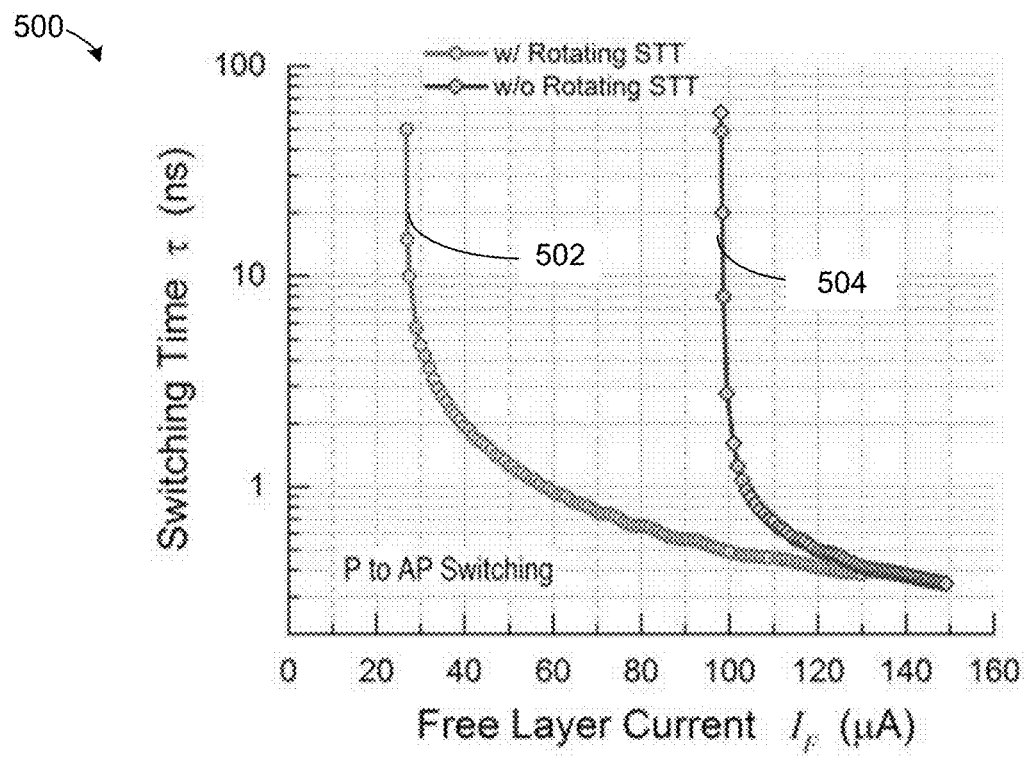
FIG. 5 shows a graph illustrating a relationship between a calculated parallel to anti-parallel (P to AP) switching time as a function of storage layer current.

FIG. 5 shows a graph 500 including a calculated parallel to anti-parallel (P to AP) switching time as a function of storage layer current ($I_F$). In order to study the effect of the rotating spin torque, the device current is modeled as two portions: $I_F$ is the current level in the storage layer, the same for the sub-layers. $I_{AF}$ is the current level in AF/F segment including the antiferromagnetic layer and the exchange-biased ferromagnetic layer. For the purpose of demonstrating the underlying physics, the two current levels are independently varied artificially as shown below. The current through the AF-F structure $I_{AF}$ is optimized at one or more values of IF, and varies from $I_{AF}$=26 μA at $I_F$=28 μA to $I_{AF}$=1 μA at $I_F$=120 μA, monotonically.

Continuing with FIG. 5, graph 500 shows the calculated storage layer magnetization switching time as function of storage layer current, with (line 502) and without (line 504) the AF/F stack, or equivalently, the rotating spin transfer torque. For P to AP switching, the electron current flows from the bottom to top in reference to resonant STT memory device 100 (or 150) shown in FIG. 1. The calculated switching time is defined as the minimum current pulse width for yielding an irreversible magnetization switching of the storage layer. For the case without the rotational STT, a conventional STT-MRAM element without the AF/F structure is modeled. For the case with the AF/F stack, the current level in the AF layer, $I_{AF}$, is optimized at one or more values of $I_F$ to obtain the shortest switching time.

As graph 500 shows, the addition of the rotating STT on the storage layer yields significant reduction of the storage layer switching current threshold, from $I_F$=100 µA to $I_F$=28 µA. For this reduction, the current in the AF/F structure is $I_{AF}$=26 µA and the corresponding AF/F spin rotational frequency is approximately f=20 GHz.

Figure 6:
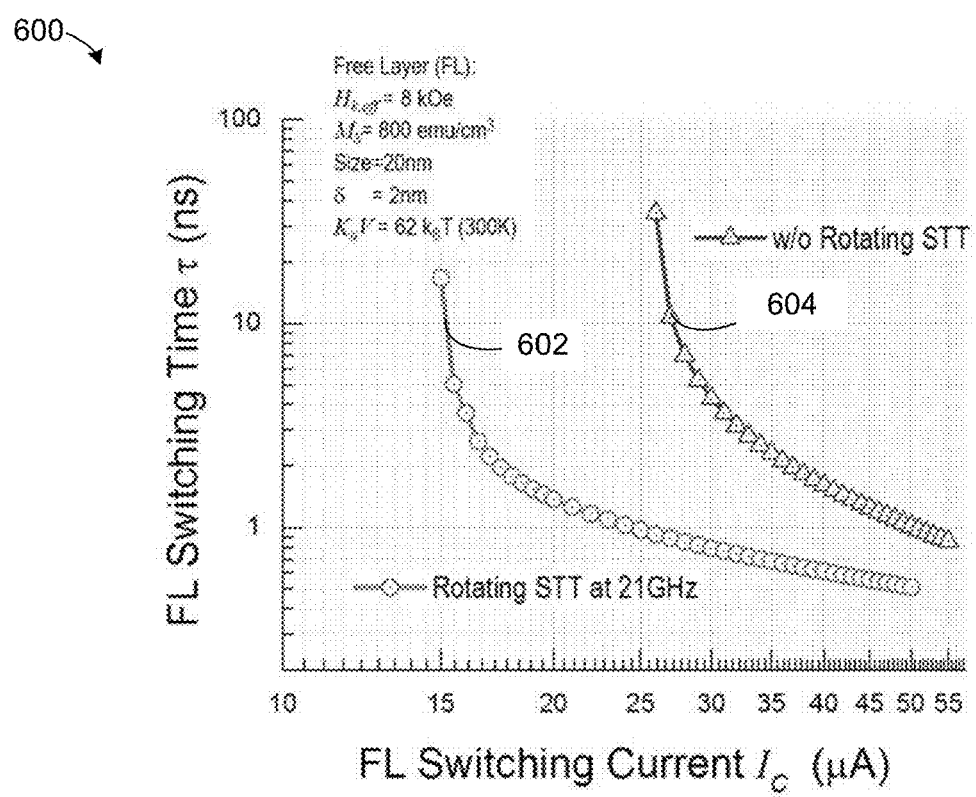
FIG. 6 shows a graph illustrating a calculated switching time as a function of current amplitude through the storage layer of the resonant STT memory device of FIGS. 1A-1B.

FIG. 6 includes graph 600 which shows the calculated switching time as a function of current amplitude through the storage layer 118, shown as plot 602. For the resonant STT memory device 100, the magnetization rotation frequency of the exchange coupled antiferromagnetic layer/ferromagnetic layer structure, AF/F, is artificially fixed at 21 GHz. The results of conventional STT MRAM part, i.e. the RRSTT-MRAM structure shown in FIG. 1A without the rotating spin polarization stack layers 108, 110, 112, 114, 116, is also plotted as plot 604 for comparison. As shown graph 600, the addition of the rotating spin transfer torque enabled the switching current threshold to reduce from 26 µA to below 15 µA, almost a factor of 2× reduction.

Figure 7:
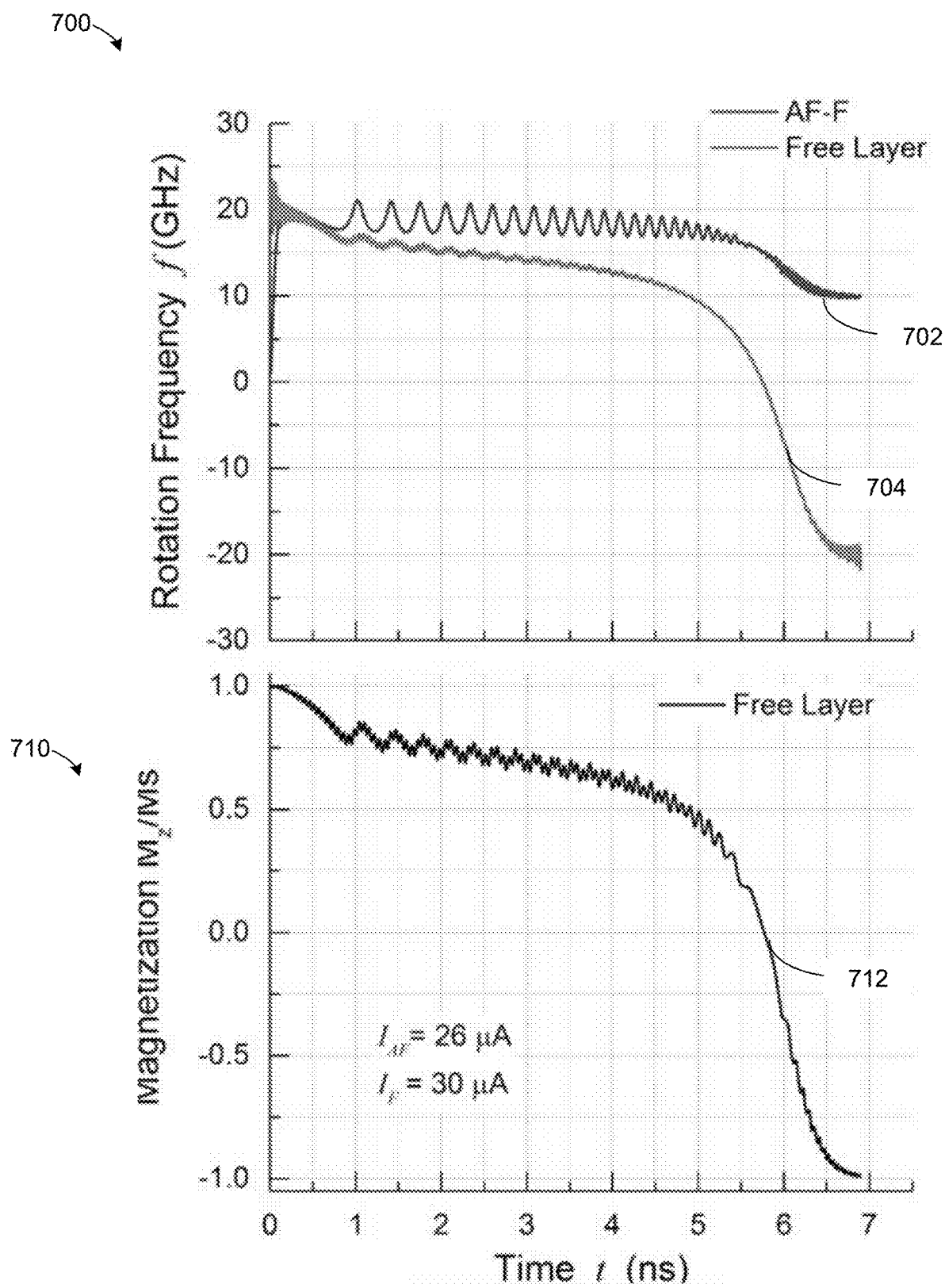
FIG. 7 shows a graph illustrating a frequency of the rotating spin torque and the precessional frequency of the storage layer magnetization during the switching process and a graph of the corresponding transient state of the perpendicular component of the storage layer magnetization.

FIG. 7 shows a graph 700 of the frequency of the rotating spin torque (702) in the storage layer and the precessional frequency of the storage layer magnetization (704) during the switching process with $I_F$=30 µA (slightly above the threshold current) and $I_{AF}$=26 µA. The perpendicular component of the storage layer magnetization is plotted in the graph below. When the current pulse started (current rise time is set at 100 ps), the rotating frequency of the AF/F oscillation quickly rises, essentially follows the current waveform. At $I_{AF}$=26 µA, the frequency of the generated rotating spin torque in the storage layer is around 20 GHz, matching almost exactly to the storage layer ferromagnetic resonance frequency: $\gamma H_{k,eff}/2\pi \approx 20$ GHz. The match of the resonance condition enables a quick magnetization rotation away from the easy axis. As the magnetization deviates away from the easy axis, with angle θ, the ferromagnetic resonance frequency of the storage layer 118 starts to decrease, $\omega=\gamma H_{k,eff} \cos \theta$ whereas the average precessional frequency of the rotating spin torque still remains essentially the same. The increased difference between the two frequencies causes the switching to slow down comparing to the very initial stage. However, the switching still continues since the antidumping spin torque arising from the reference layer polarization increases with the increase θ due to its sin θ-dependence.

The wiggles shown in the AF/F precessional frequency-time plot (702) is the result of the back spin transfer torque from the current polarization effect by the storage layer magnetization. This spin transfer torque mediated interaction between the AF exchange-biased ferromagnetic layer and the storage layer 118 is also evident as the AF/F precessional frequency start to decrease significantly when the chirality of the storage layer magnetization precession reverses due to the reverse of its perpendicular component.

FIG. 7 includes a graph 710 showing the corresponding transient state 712 of the perpendicular component of the storage layer magnetization during the reversal process.

Figure 8A:
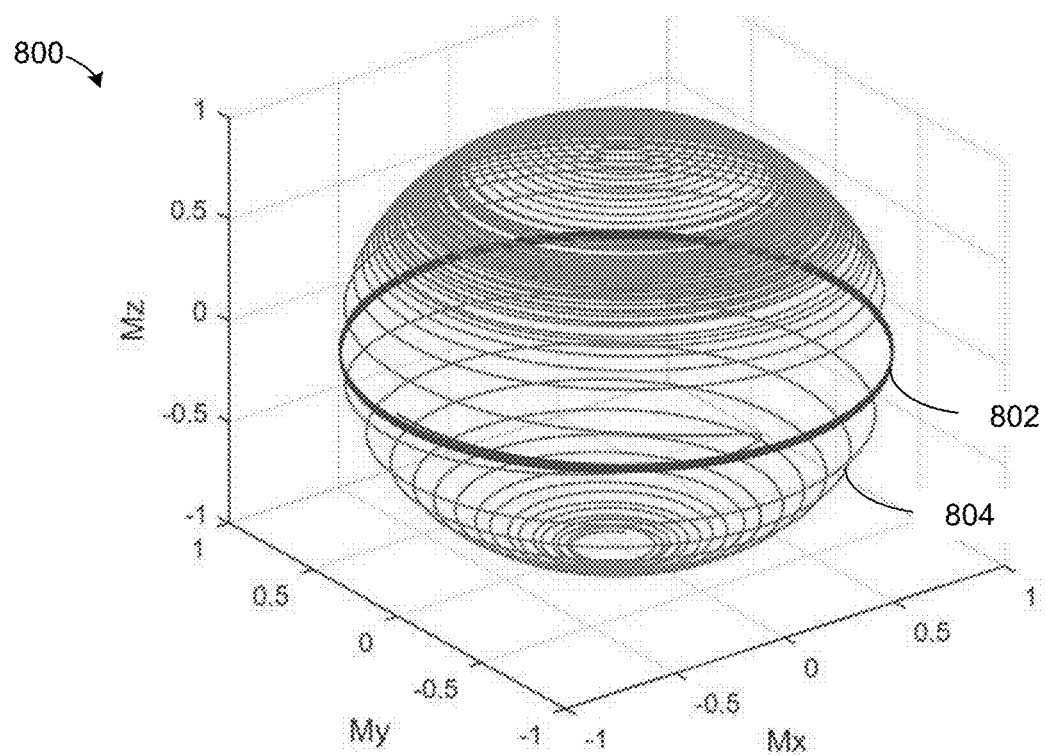
FIGS. 8A-8B show graphs of a magnetization trajectories of a storage layer of a resonant STT memory device of FIGS. 1A-1B.

FIG. 8A shows a graph 800 the magnetization trajectories of the storage layer (804) and the ferromagnetic layer (802) of the AF/F structure at $I_F$=28 µA and $I_{AF}$=26 µA with identical pulsed current waveform of a duration τ=10 ns. The rotation of the in-plane STT is steady and the magnetization trajectory is essentially confined within the film plane.

Figure 8B:
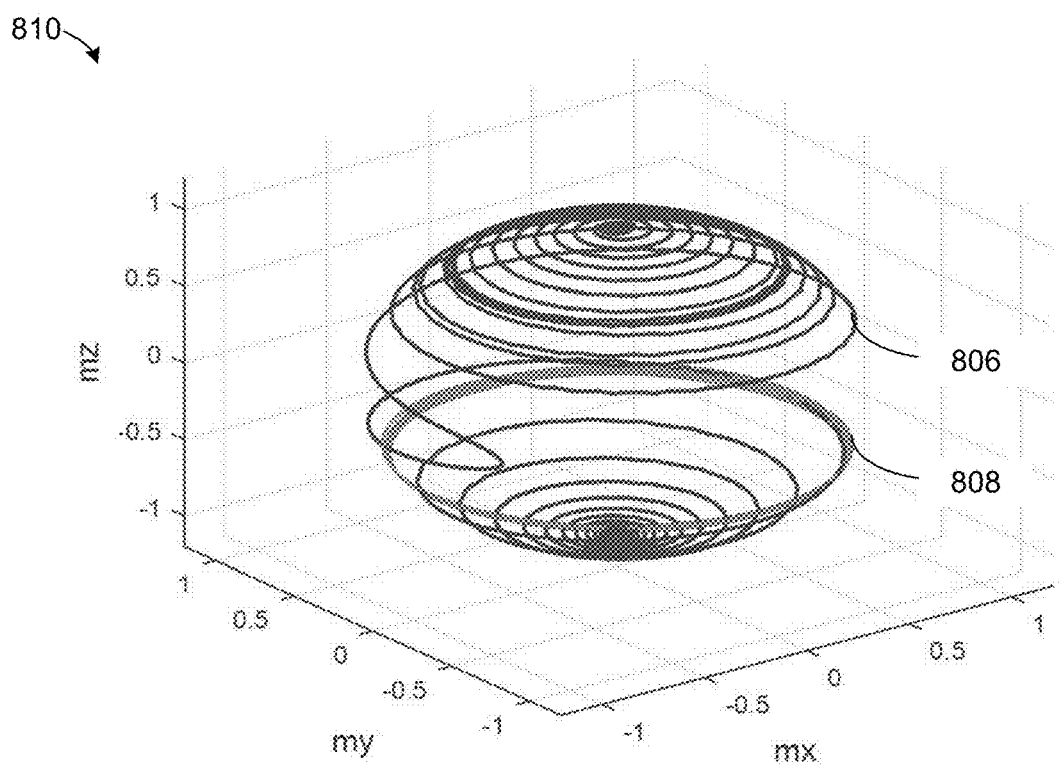

FIG. 8B includes a graph 810 showing a case of rotating spin transfer torque facilitated magnetization reversal of a storage layer via micromagnetic simulation. In particular, the figure shows the trajectories of the storage layer 118 magnetization (806) and the exchange biased spin polarization layer (808) during a current pulse. The rotating spin transfer torque facilitates the magnetization precession of the storage layer magnetization, yielding the magnetization reversal. In this case, the current also generates a spin transfer torque arising from the spin polarization by the reference layer on the other side of the tunnel barrier. However, this spin transfer torque is not sufficient alone to initiate the magnetization precession. The magnetization precession is initiated by the combination of this spin transfer torque and the rotating spin transfer torque.

Figure 9:
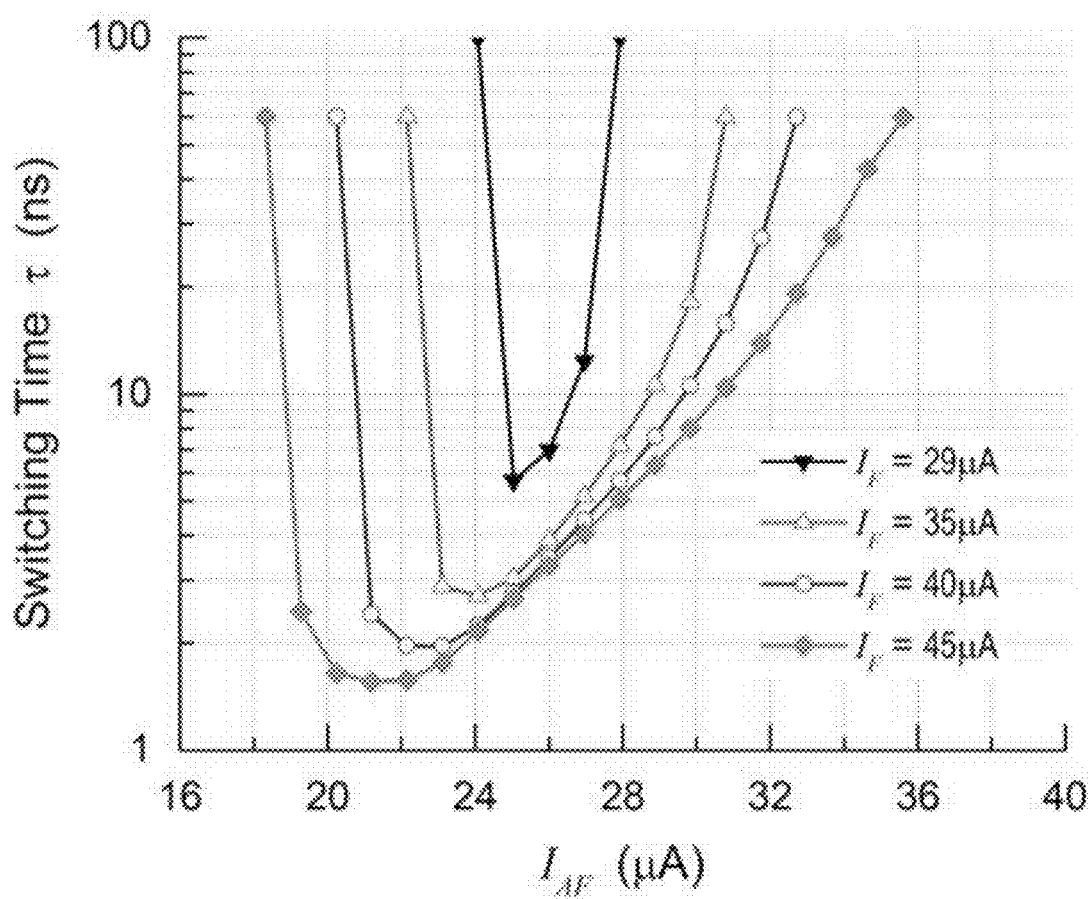
FIG. 9 shows a graph illustrating a switching time.

FIG. 9. shows a graph 900 including plots of the switching time as a function of the current level at the AF/F structure, which linearly scales with the frequency of the rotating in-plane spin transfer torque. The amplitude of the rotating spin transfer torque in the storage layer 118 is maintained at a constant value for the curves because it is determined by $I_F$. The calculated switching time as a function of $I_{AF}$, the current level in the AF-F structure, for a set of fixed storage layer currents $I_F$. The magnitude of the rotating STT in the storage layer 118 is set by the value IF while $I_{AF}$ mainly changes the frequency of the rotating STT. Near the threshold storage layer current, $I_F$=29 µA, the window of $I_{AF}$ for small switching time is narrow and is characteristic nature of resonance switching: the frequency of the rotating STT needs to be well matched with the ferromagnetic resonance frequency of the storage layer. The resonance condition enables energy being pumped into the storage layer 118 with the rotating STT and consequently yielding switching at much lower storage layer current. At $I_F$ values higher than the threshold, the resonance requirement relaxes and the window of $I_{AF}$ broadens accordingly. As the switching window for the $I_{AF}$ broadens, the optimum $I_{AF}$ value corresponding to minimum switching time also shifts to lower numbers, indicating that the fastest switching would occur at lower precessional frequency. As such, as the anti-damping spin transfer torque on the storage layer magnetization increases, the optimal frequency of the rotating spin transfer torque reduces in value.

Figure 10:
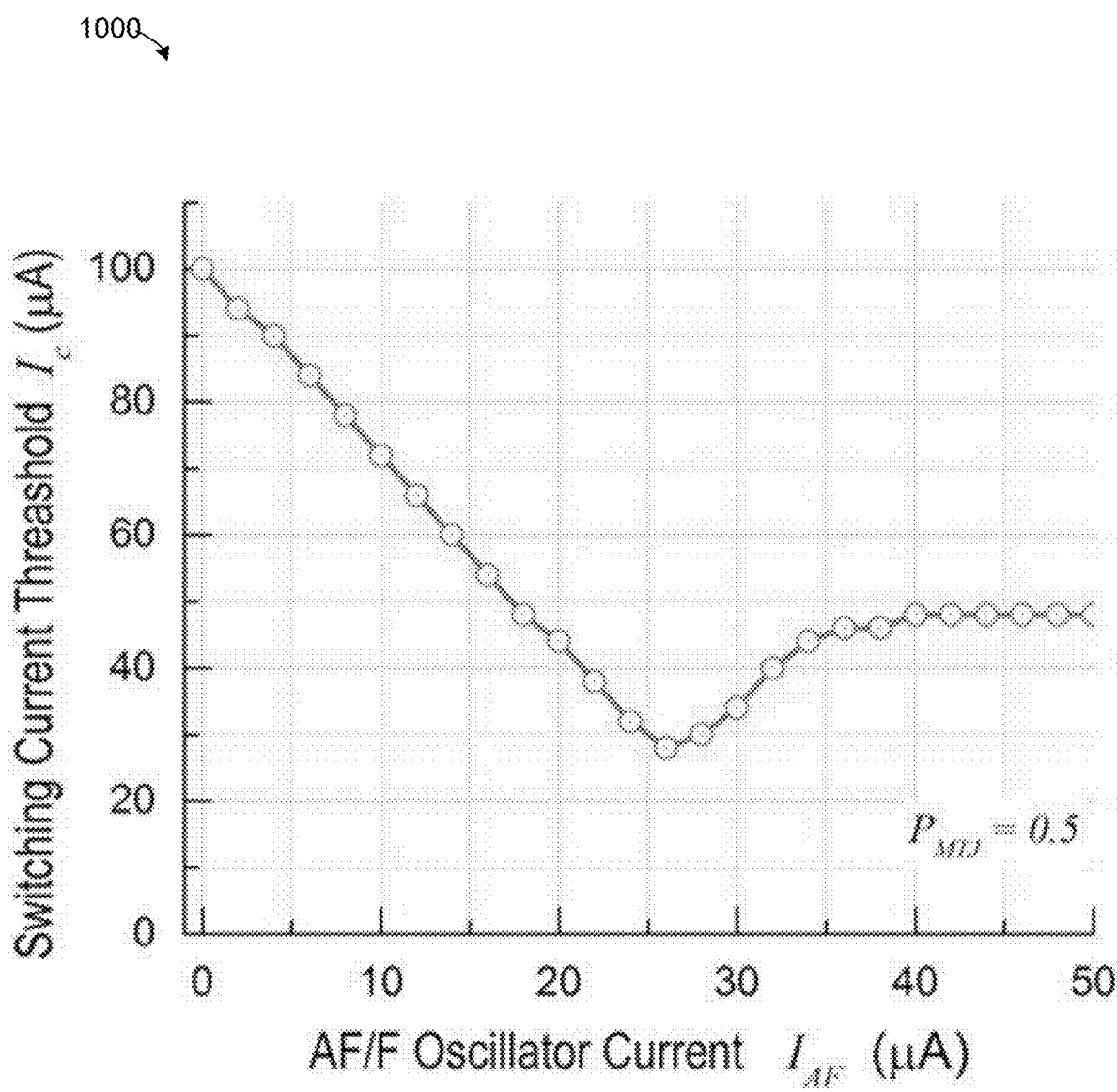
FIG. 10 shows a graph illustrating a calculated storage layer switching current threshold.

This resonance magnetization switching resembles many of the same characteristics of the microwave assisted magnetic recording. FIG. 10 includes a graph 1000 that shows the calculated storage layer switching current threshold as a function of $I_{AF}$, the current level in the AF/F structure. The frequency of the rotating STT scales with $I_{AF}$. This case is for P-to-AP switching.

The storage layer 118 current threshold is defined as the minimum current level for yielding a switching time below 10 ns. Since the rotational frequency of the rotating STT scales with the magnitude of $I_{AF}$, the plot can be viewed as the threshold storage layer switching current vs. the frequency of rotating STT. As shown in the figure, the reduction of the storage layer switching current threshold is essentially a linear function of the frequency of the rotating STT between zero to the ferromagnetic resonance frequency magnetic element. This characteristic behavior of resonance switching provides practicality to the viability of this scheme. The AF/F precessional frequency does not have to precisely match the ferromagnetic resonance frequency of the storage layer to have this scheme to work in practice. Graph 1000 shows that matching AF/F frequency and the ferromagnetic resonance frequency exactly is not necessary for this scheme to work. In practice, the task becomes material/design optimization for maximizing the assist effect.

The above description has focused on the storage layer magnetization switching from the parallel state to the antiparallel state, P to AP switching. The effect of the rotating STT on the antiparallel to parallel (AP to P) switching with the optimal design for the P to AP switching, except the current polarity reverses.

Figure 11:
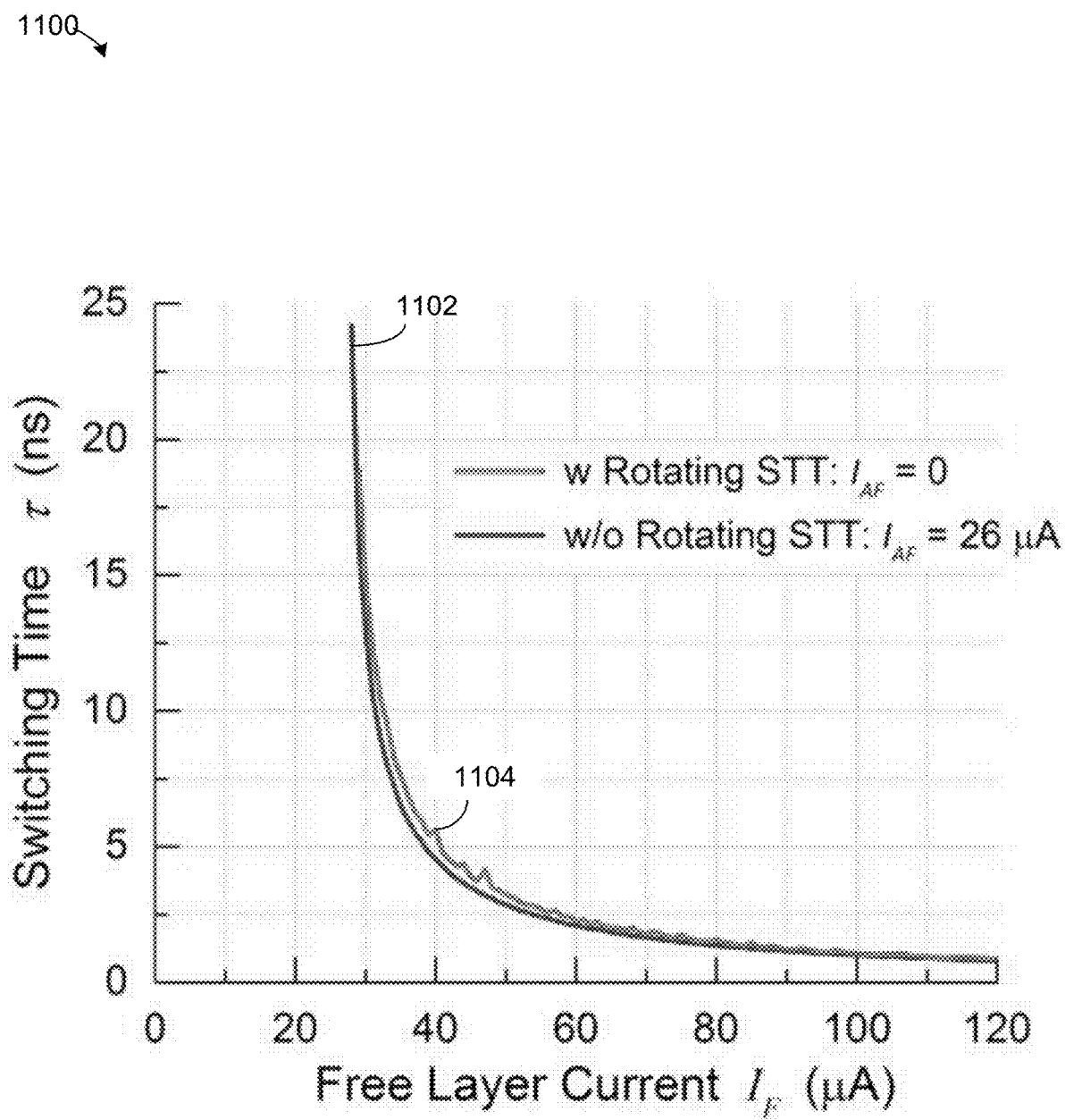
FIG. 11 shows a graph illustrating switching times for STT devices.

FIG. 11 includes a graph 1100 showing the results of conventional STT switching without the AF/F stack (1102) and switching with the rotating STT at $I_{AF}$=26 µA (1104). The electron current polarity is reversed in reference to that shown in FIG. 5. The two curves are almost identical, indicating that the rotating STT in this case has little effect on the switching. This result can be explained as the following. Using the resonant STT memory device 100 or resonant STT memory device 150, when the electron current flows from top to bottom of the device 100 as shown in FIG. 1A, which corresponds to the AP to P switching, the spin transfer from the storage layer 118 to the exchange-biased layer 114 intends to align the magnetizations of the two layers into parallel state. Whereas the back spin transfer torque from the exchange bias layer 114 to the storage layer 118 tends to align the in plane components of the two magnetizations antiparallel to each other. Although the chirality of the storage layer magnetization precession and the in plane magnetization rotation of the exchange-biased layer are the same, the effect of spin transfer from the storage layer 118 to the exchange-biased layer 114 appears to be stronger than the back spin transfer from exchange-biased layer, which is of the rotating STT in the storage layer 118.

Even though the rotating spin transfer torque presents little effect on AP to P switching, the significant current threshold reduction for the P to AP switching should present as a significant advantage for lowering the switching power.

Figure 12:
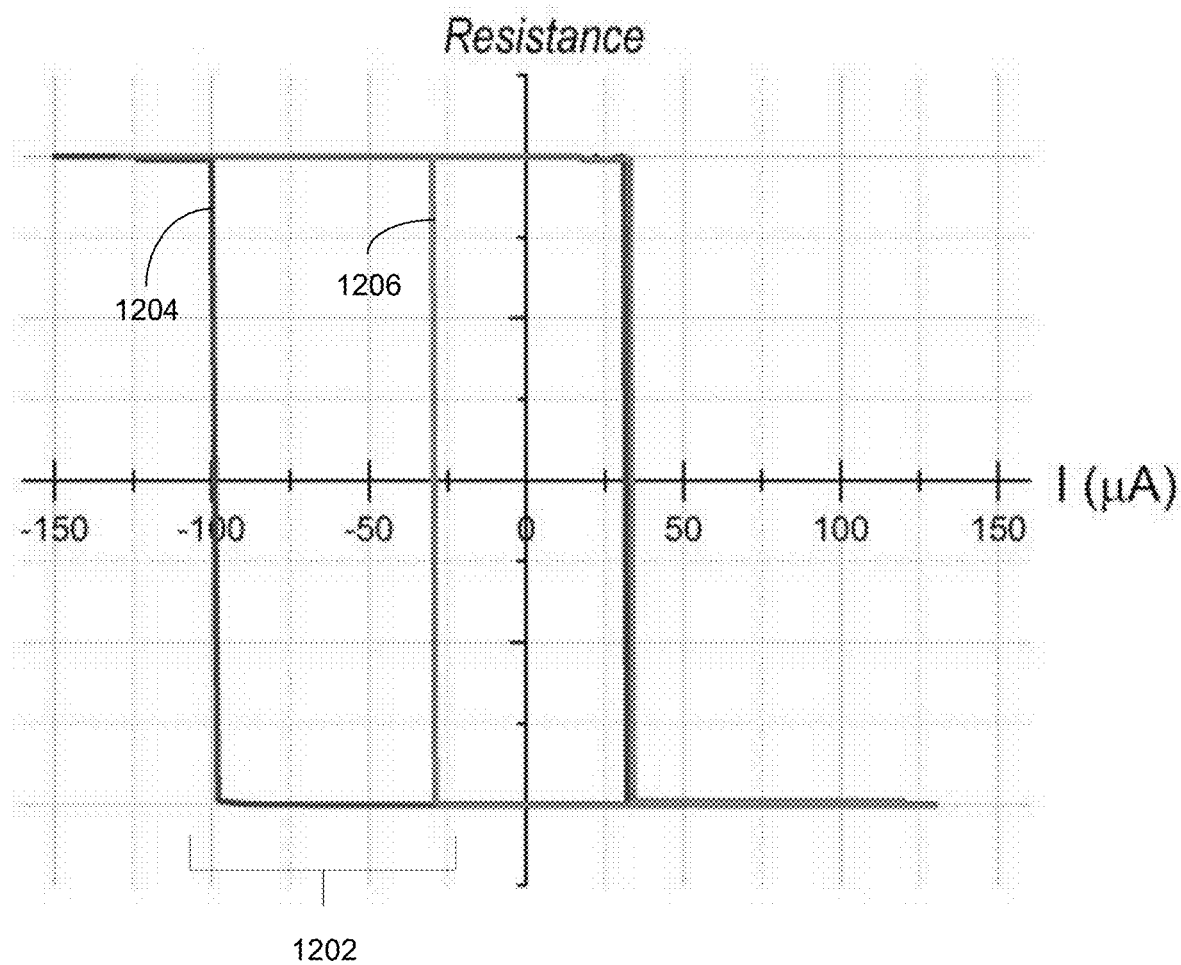
FIG. 12 shows a graph illustrating a current switching hysteresis curve.

FIG. 12 includes a graph 1200 that shows a current switching hysteresis curve with $I_{AF}=I_F$ to simulate a realistic case (1202). The result without the AF/F stack is plotted (1204) for comparison. Without the rotating spin transfer torque, the switching current threshold is very asymmetric. With the addition of the rotating spin transfer torque at optimized condition, the switching current for P-to-AP switching is significantly reduced, making the switching current roughly symmetric.

The significant switching current threshold reduction for P to AP switching, shown as difference 1202, makes the current switching hysteresis loop roughly symmetric since the current threshold for P to AP switching with the rotating STT becomes similar to that of the AP to P switching. As shown in FIG. 12, the current threshold reduction is approximately 65%. A driving transistor circuit might be able to take the advantage of this new switching characteristic for lowering the memory system power consumption.

The addition to the conventional STT MRAM memory element design is configured to significantly reduce the threshold current for P to AP switching (relative to a current for P to AP switching in a device without the resonant STT portion). The P to AP switching current is typically greater than the current for AP to P switching. Reducing the current for P to AP switching thus enables use of lower switching currents in the resonant STT memory device 100. Because lower currents can be used to switch the memory state of the resonant STT memory device 100 (e.g., compared to a conventional memory device), a size of the resonant STT memory device 100 (and associated transistors in the memory device) can be reduced relative to the size of the conventional memory device. An antiferromagnetic material based film stack produces an additional in-plane rotating spin transfer torque in the storage layer 118 during write operation. Such a rotating spin transfer torque results in reduction of the switching current threshold. When the frequency matches with the ferromagnetic resonance frequency of the storage layer 118, the reduction of switching current threshold is maximized and becomes very significant (e.g., greater than 65%). The design can enable nearly symmetric switching current thresholds for the switching from and to the two opposite polarities. The rotating spin transfer torque is much more effective than a rotating magnetic field for the same reason that spin transfer torque is used to reversed the storage layer magnetization instead of ampere field. One of the fundamental reason lies in the damping term of Eq. (3): the effect of the magnetic field is scaled down by a multiplication factor of Gilbert damping constant and the spin transfer torque is not. Low Gilbert damping values for storage layer is also key to assist effect by the rotating spin transfer torque.

Figure 13:
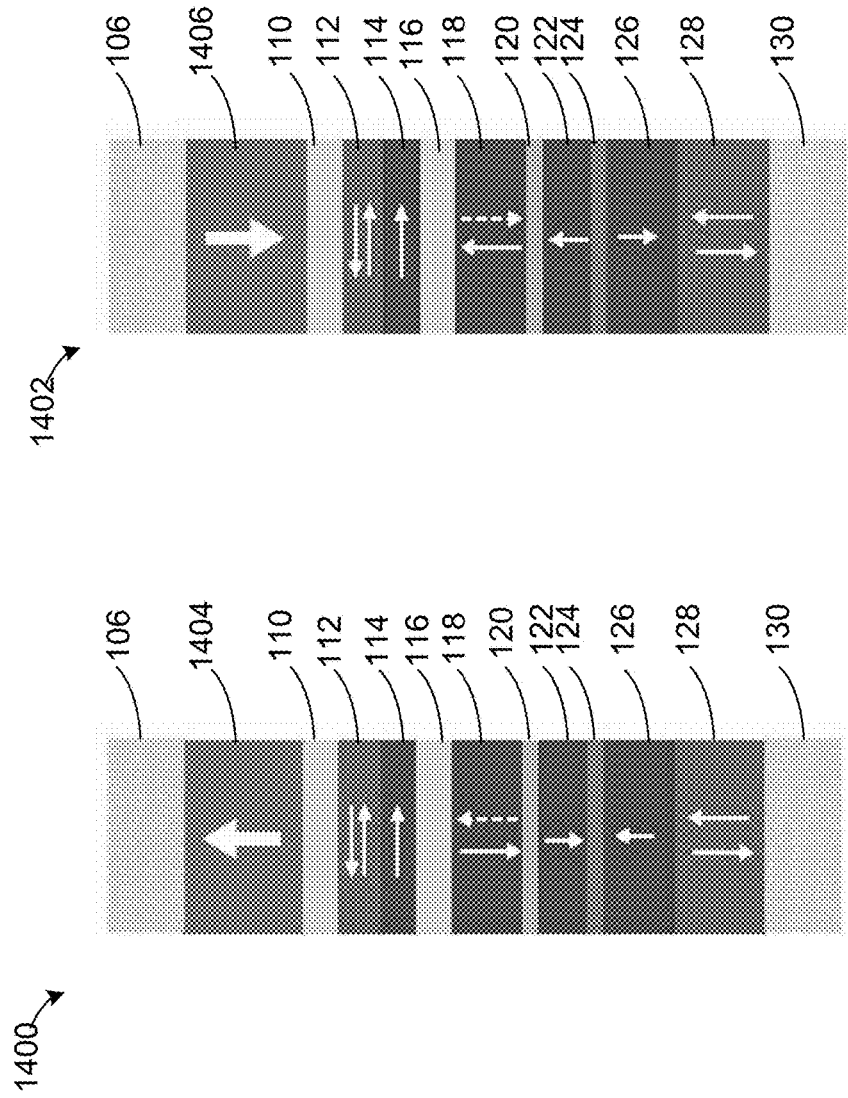
FIG. 13 shows diagrams of example resonant STT memory devices.

FIG. 13 shows that the same resonant STT memory device 100 structure can be fabricated either with the perpendicular polarization layer 108 at the bottom of the stack or at the top of the stack. FIG. 13 shows two different resonant STT memory devices 1400, 1402 with two opposite magnetization orientations of respective perpendicular polarization layers 1404, 1406 (corresponding to polarization layer 108 of FIG. 1A, 1B). The magnetization vector labeled for the magnetic layers depends on the magnetization orientation of the perpendicular polarization layer 1404, 1406.

Figure 14:
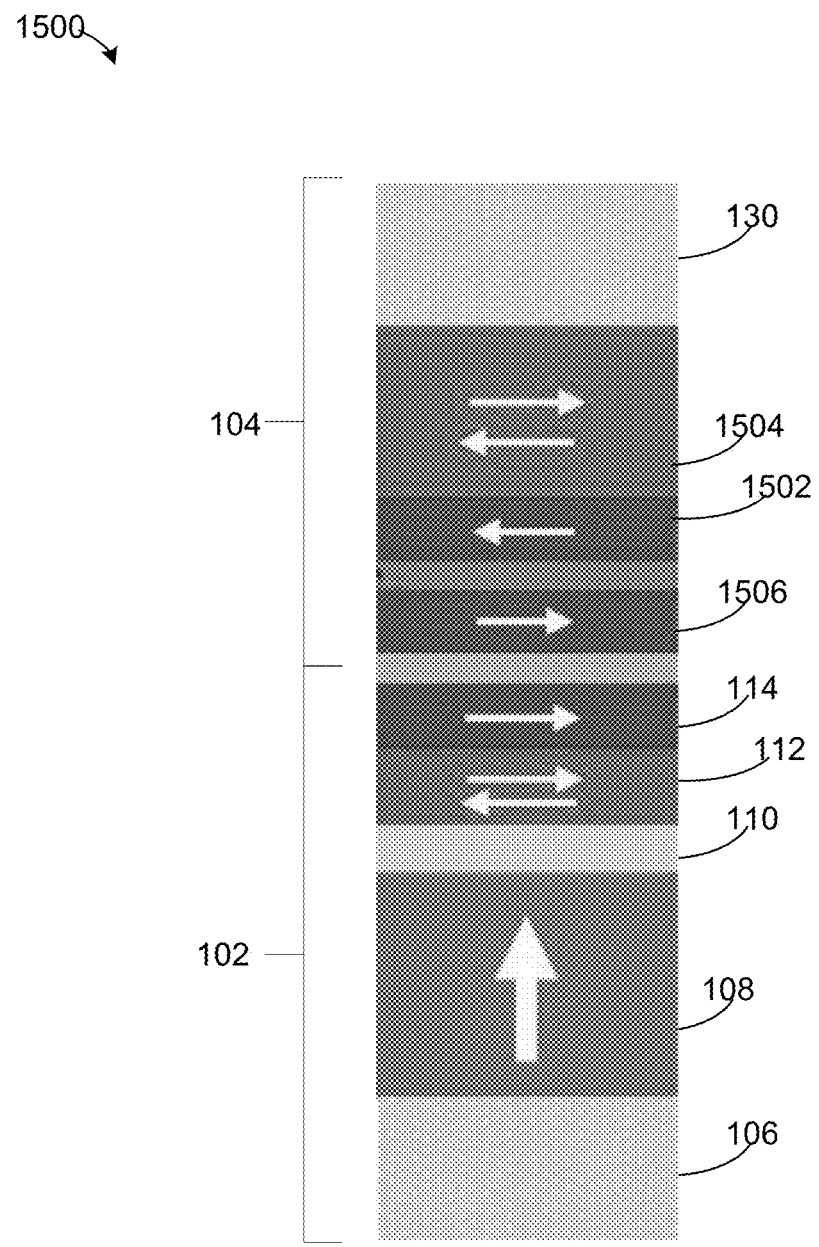
FIG. 14 shows a diagram of an example electric/magnetic oscillator including a spin polarization layer.

FIG. 14 shows the rotating spin polarization device 1500 being used as an electric/magnetic oscillator with oscillation frequency approximately linearly proportional to the current amplitude. The rotating spin polarization device 1500 includes an oscillation portion 1510 paired with the rotating spin polarizer 102 With an electric current flowing through the device 1500, the antiferromagnetic exchange coupled spins in the antiferromagnetic material 1502 will precess, i.e. rotate around the perpendicular direction. Since the adjacent ferromagnetic layer 1504 is exchange coupled to the antiferromagnetic layer 1502 through the interfacial exchange coupling in favor of one parallel set of the spins in the antiferromagnetic layer, the magnetization of the ferromagnetic layer will rotate around the perpendicular direction with magnetization approximately within the film plane. This will cause the resistance of the device 1500 to oscillate accordingly due to either the formed magnetic tunnel junction or the giant magnetoresistance structure having the magnetization of the reference layer 1506 "pinned".

For the above antiferromagnetic material based spin torque structure, the strength of the antiferromagnetic exchange coupling between the spins in the antiferromagnetic material enables the oscillation frequency to reach the tera-Hz regime ($10^{12}$ Hz) and provide sufficiently high current amplitude. By varying the current amplitude, the oscillation can be tuned from GHz (109 Hz) range to THz (1012 Hz) range.

While this specification contains many specific implementation details, these should not be construed as limitations on the scope of any invention or of what may be claimed, but rather as descriptions of features that may be specific to particular embodiments of particular devices. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Particular embodiments of the subject matter have been described. Other embodiments are within the scope of the following claims. As one example, the processes depicted in the accompanying figures do not necessarily require the particular order shown, or sequential order, to achieve desirable results.

What is claimed is:

1. A memory device comprising a plurality of layers forming a stack, the plurality of layers comprising:
    a spin polarization layer including a magnetic anisotropy approximately perpendicular to a plane of the spin polarization layer;
    an antiferromagnetic layer comprising an antiferromagnetic material, wherein the spin polarization layer is configured to cause a first spin magnetization in the antiferromagnetic layer at a rotation frequency in response to an electric current through the stack;
    a ferromagnetic layer that is exchange coupled to the antiferromagnetic layer, wherein the antiferromagnetic layer is between the ferromagnetic layer and the spin polarization layer, wherein the spin polarization layer is configured to generate a perpendicular polarized current in the antiferromagnetic layer, and wherein the first spin magnetization in the antiferromagnetic layer is based on the perpendicular polarized current and causes a second spin magnetization in the ferromagnetic layer at the rotation frequency;
    wherein a coupling between the antiferromagnetic layer and the ferromagnetic layer causes the first spin magnetization of the antiferromagnetic layer to precess within a threshold spin canting angle of a plane of the antiferromagnetic layer, and wherein the rotation frequency is independent of a magnitude of the effective anisotropy field of the antiferromagnetic layer; and
    a storage layer having a magnetization direction that indicates a memory state of the storage layer, the memory state configured to be switched based on the second spin magnetization in the ferromagnetic layer causing a spin polarization of the electric current in the storage layer at the rotation frequency, wherein the rotation frequency corresponds to a ferromagnetic resonance frequency of the storage layer;
    wherein causing the spin polarization of the electric current in the storage layer at the rotation frequency reduces an amount of the electric current through the stack for switching the magnetization direction of the storage layer relative to an amount of current through a memory device without causing the spin polarization of the electric current in the storage layer at the rotation frequency.

2. The memory device of claim 1, wherein the amount of the electric current through the stack for switching the magnetization direction of the storage layer is reduced by more than 60%.

3. The memory device of claim 1, wherein the ferromagnetic layer comprises a synthetic antiferromagnet tri-layer formed by two ferromagnetic layers sandwiching a metal layer, and wherein the two ferromagnetic layers are configured for antiparallel coupling.

4. The memory device of claim 1, further comprising:
    a reference layer comprising a magnetic anisotropy approximately perpendicular to a plane of the reference layer, the storage layer being between the reference layer and the antiferromagnetic layer, the reference layer configured to form a magnetization orientation reference for the magnetization direction of the storage layer, wherein the reference layer is further configured to cause a resistance difference between a first magnetization direction and a second, opposite magnetization direction of the storage layer.

5. The memory device of claim 4, further comprising:
    a layer of insulating material forming a tunnel barrier disposed between the storage layer and the reference layer, the layer of insulating material forming a magnetic tunnel junction with the storage layer and the reference layer.

6. The memory device of claim 4, further comprising:
    a layer of insulating material forming a metallic non-magnetic conducting layer in between the storage layer and the reference layer, the layer of insulating material forming a magnetoresistive tri-layer structure with the storage layer and the reference layer.

7. The memory device of claim 4, further comprising:
    a flux compensation layer comprising a perpendicular magnetic anisotropy relative to a plane of the flux compensation layer, the reference layer being between the flux compensation layer and the storage layer, wherein a magnetization direction of the flux compensation layer is approximately opposite to the magnetic direction of the reference layer, and wherein the flux compensation layer configured to compensate for stray magnetic flux from the reference layer.

8. The memory device of claim 7, further comprising:
    an interlayer disposed between the flux compensation layer and the reference layer, the interlayer configured to facilitate antiparallel magnetic coupling between the flux compensation layer and the reference layer; and
    an additional antiferromagnetic layer configured to provide exchange pinning to the magnetization direction of the flux compensation layer, wherein the flux compensation layer is between the additional antiferromagnetic layer and the reference layer.

9. The memory device of claim 1, further comprising:
    a non-magnetic interlayer disposed between the spin polarization layer and the antiferromagnetic layer, the non-magnetic interlayer comprising one or both of a non-magnetic conducting layer and a thin tunnel barrier.

10. The memory device of claim 1, further comprising:
    a non-magnetic interlayer disposed between the ferromagnetic layer and the storage layer, the non-magnetic interlayer comprising one or both of a non-magnetic conducting layer and a thin tunnel barrier.

11. The memory device of claim 1, further comprising:
    a conducting electrode disposed adjacent to the spin polarization layer for contacting a current source for the stack.

12. The memory device of claim 1, wherein the antiferromagnetic layer further comprises:
    a mechanism configured to maintain a plurality of antiferromagnetic coupled spins approximately antiparallel to each other within a plane of the antiferromagnetic layer, wherein the plurality of antiferromagnetic coupled spins are configured to be aligned either parallel or antiparallel to the magnetization direction of the ferromagnetic layer; and a magnetic anisotropy configured to maintain the plurality of antiferromagnetic coupled spins approximately within the plane.

13. The memory device of claim 12, wherein the ferromagnetic layer further comprises:
a mechanism to ensure that a magnetization of the ferromagnetic layer is exchange coupled to one set of the plurality of antiferromagnetic coupled spins of the antiferromagnetic layer at an interface between the ferromagnetic layer and antiferromagnetic layer.

14. The memory device of claim 1, wherein the spin polarization layer comprises one or more of a Co/Ni, a Co/Pt, or a Co/Cu multilayer superlattice, or one or more of Co, Fe, or CoFeB thin film layers coupled to an underlayer material.

15. The memory device of claim 1, further comprising:
one or more underlayers disposed adjacent to the spin polarization layer, the one or more underlayers configured to facilitate a crystalline texture for the spin polarization layer and increase a magnitude of the magnetic anisotropy of the spin polarization layer.

16. A memory device for a computing system, the memory device comprising a plurality of layers forming a stack, the plurality of layers comprising:
a first electrode configured to receive electric current for the stack from a read/write line of the memory device;
a spin polarization layer adjacent to the first electrode and configured to receive the electric current from the first electrode, the spin polarization layer having a magnetic anisotropy approximately perpendicular to a plane of the spin polarization layer;
an antiferromagnetic layer comprising an antiferromagnetic material and configured to receive the electric current from the spin polarization layer, wherein the spin polarization layer is configured to cause a first spin magnetization in the antiferromagnetic layer at a rotation frequency in response to the electric current;
a non-magnetic interlayer disposed between the spin polarization layer and the antiferromagnetic layer, the non-magnetic interlayer comprising a non-magnetic conducting material;
a ferromagnetic layer that is exchange coupled to the antiferromagnetic layer, wherein the antiferromagnetic layer is between the ferromagnetic layer and the spin polarization layer, wherein the spin polarization layer is configured to generate a perpendicular polarized current in the antiferromagnetic layer, and wherein the first spin magnetization in the antiferromagnetic layer is based on the perpendicular polarized current and causes a second spin magnetization in the ferromagnetic layer at the rotation frequency;
wherein a coupling between the antiferromagnetic layer and the ferromagnetic layer causes the first spin magnetization of the antiferromagnetic layer to precess within a threshold spin canting angle of a plane of the antiferromagnetic layer, and wherein the rotation frequency is independent of a magnitude of the effective anisotropy field of the antiferromagnetic layer; and
a storage layer having a magnetization direction that indicates a memory state of the storage layer, the memory state configured to be reversed based on the second spin magnetization in the ferromagnetic layer causing a spin polarization of the electric current in the storage layer at the rotation frequency, wherein the rotation frequency corresponds to a ferromagnetic resonance frequency of the storage layer;
a reference layer having a magnetic anisotropy approximately perpendicular to a plane of the reference layer, the reference layer configured to provide a magnetic direction reference for the magnetization direction of the storage layer and causing a resistance difference between two opposite magnetization directions of the storage layer;
a metallic non-magnetic conducting layer disposed between the storage layer and the reference layer to form a magnetic tunnel junction;
a flux compensation layer having a magnetization direction that is approximately opposite to the magnetization direction of the reference layer, the flux compensation layer configured to compensate for stray magnetic flux from the reference layer;
a pinning layer configured to provide exchange pinning to the magnetization direction of the flux compensation layer; and
a second electrode configured to return current from the stack to the memory device.

17. The memory device of claim 16, wherein the electric current is less than 50 µA to cause the memory state configured to be reversed in less than 10 nanoseconds.

18. The memory device of claim 16, wherein a planar size of each layer of the plurality of layers of the stack is between approximately 10 nm by 10 nm and approximately 20 nm by 20 nm.

19. The memory device of claim 16, wherein the first electrode and second electrode each comprise one of Cu, CuNi, Pt, and Ir;
wherein the spin polarization layer comprises one of Co/Pt multilayer, a Co/Ni multilayer, a Co/Pd multilayer, or FePt-L10;
wherein the non-magnetic interlayer comprises one of Cu, Cr, or MgO;
wherein the antiferromagnetic layer comprises one of IrMn, PdMn, or FeMn;
wherein the ferromagnetic layer comprises one of Co, Fe, FeCo, or NiFe;
wherein the storage layer comprises FeCoB;
wherein the metallic non-magnetic conducting layer comprises MgO;
wherein the reference layer comprises FeCoB;
wherein the flux compensation layer comprises one of FeCoB, or a Co/Pt multilayer; and
wherein the pinning layer comprises IrMn.

* * * * *